United States Patent
Kim et al.

(10) Patent No.: US 11,735,417 B2
(45) Date of Patent: Aug. 22, 2023

(54) HETEROJUNCTION MATERIAL AND METHOD OF PREPARING THE SAME

(71) Applicant: Research & Business Foundation Sungkyunkwan University, Suwon-si (KR)

(72) Inventors: Taesung Kim, Seoul (KR); Hyunho Seok, Anyang-si (KR); Hyeong U Kim, Ansan-si (KR); Jinill Cho, Busan (KR); Kanade Chaitanya Kaluram, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 121 days.

(21) Appl. No.: 17/325,545

(22) Filed: May 20, 2021

(65) Prior Publication Data
US 2021/0366708 A1    Nov. 25, 2021

(30) Foreign Application Priority Data
May 20, 2020    (KR) .......................... 10-2020-0060460

(51) Int. Cl.
| | | |
|---|---|---|
| H01L 21/00 | (2006.01) | |
| H01L 21/02 | (2006.01) | |
| H01L 29/225 | (2006.01) | |
| H01L 29/24 | (2006.01) | |
| H01L 29/861 | (2006.01) | |
| H01L 29/267 | (2006.01) | |

(52) U.S. Cl.
CPC .. *H01L 21/02614* (2013.01); *H01L 21/02422* (2013.01); *H01L 29/225* (2013.01); *H01L 29/24* (2013.01); *H01L 29/242* (2013.01); *H01L 29/267* (2013.01); *H01L 29/861* (2013.01); *H01L 21/0256* (2013.01); *H01L 21/02557* (2013.01); *H01L 21/02562* (2013.01); *H01L 21/02568* (2013.01)

(58) Field of Classification Search
None
See application file for complete search history.

(56) References Cited

U.S. PATENT DOCUMENTS

2021/0202265 A1* 7/2021 Chuu ................... H01L 21/441

FOREIGN PATENT DOCUMENTS

| KR | 10-1523172 B1 | 5/2015 |
|---|---|---|
| KR | 10-2018-0117762 A | 10/2018 |

OTHER PUBLICATIONS

Translation of Choi, KR 10-1523172 B1, 2022.*
Korean Office Action dated Jun. 28, 2021 in counterpart Korean Patent Application No. 10-2020-0060460 (5 pages in English, 5pages in Korean).

* cited by examiner

*Primary Examiner* — Richard A Booth
(74) *Attorney, Agent, or Firm* — NSIP Law

(57) ABSTRACT

A method of preparing a heterojunction material, includes forming a first transition metal on a substrate, forming a second transition metal on the first transition metal, and performing a plasma process containing a chalcogen source on the substrate. The first transition metal and the second transition metal are different from each other.

11 Claims, 24 Drawing Sheets
(2 of 24 Drawing Sheet(s) Filed in Color)

FIG. 16
(a)
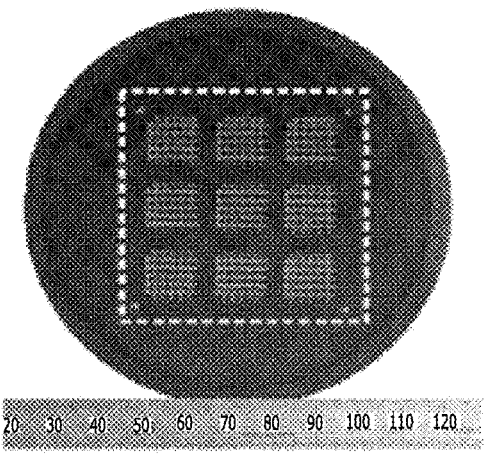
(b)
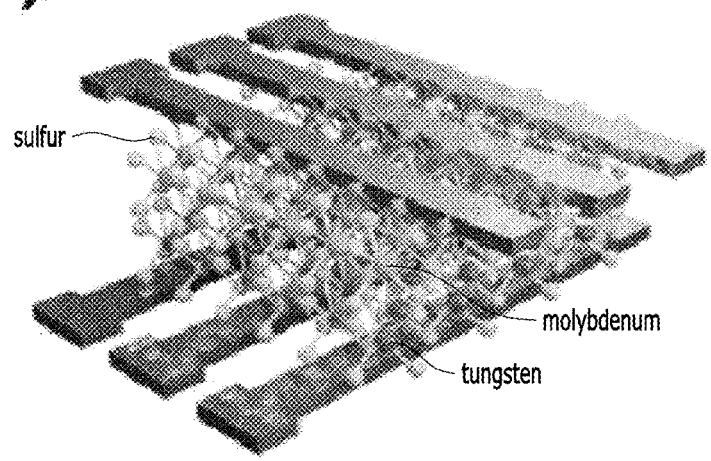
(c)
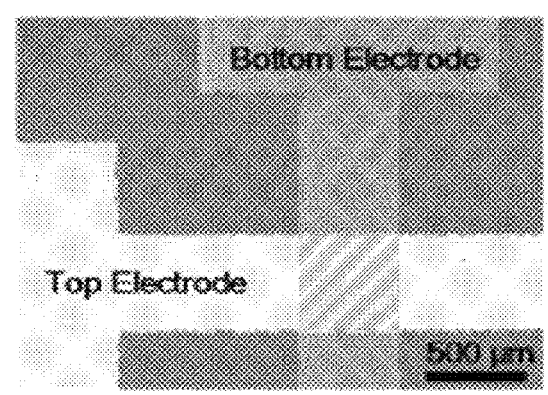

FIG. 23
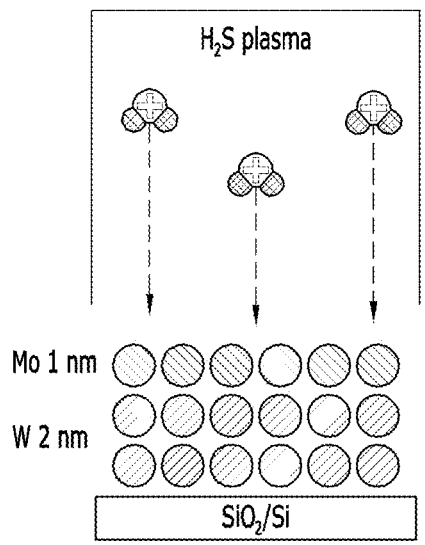
(a)
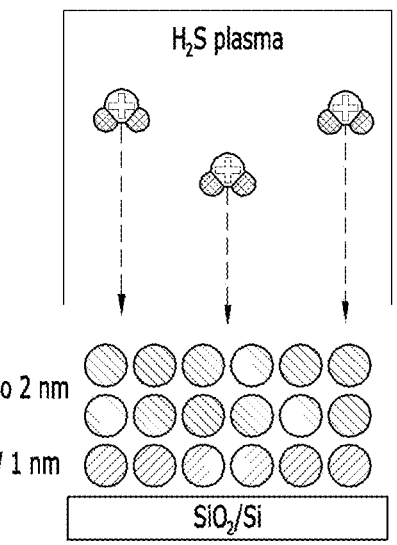
(b)
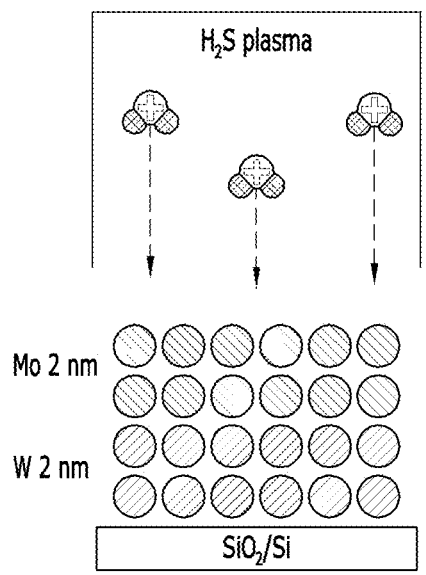
(c)

HETEROJUNCTION MATERIAL AND METHOD OF PREPARING THE SAME

CROSS-REFERENCE TO RELATED APPLICATION

This application claims the benefit under 35 USC 119(a) of Korean Patent Application No. 10-2020-0060460 filed on May 20, 2020, in the Korean Intellectual Property Office, the entire disclosure of which is incorporated herein by reference for all purposes.

BACKGROUND

1. Field

The following description relates to a heterojunction material and a method of preparing the same.

2. Description of Related Art

Two-dimensional transition metal chalcogenides have various band gaps depending on the number of layers. A band gap of a transition metal chalcogenide can be controlled in the form of a heterojunction, which makes it possible to obtain desired properties and can be applied to various studies in the fields of electronic devices and energy. However, so far, there has been no method of fabricating a large-area uniform heterojunction structure, and, thus, there has been no progress in commercialization and studies.

More specifically, conventionally, a heterojunction structure of a two-dimensional nanomaterial (transition metal chalcogenide, graphene, or the like) can be fabricated only by a dry transfer method, and the fabricated structure has a micron-scale size. The dry transfer method has a low reproducibility and uses a polymer, and, thus, a foreign substance (polymer residue) causes degradation in performance. Also, the dry transfer method is not suitable for large-area fabrication.

Also, a heterojunction structure fabricated by conventional chemical vapor deposition is formed based on a triangular nucleation rather than a film-shaped nucleation and thus shows a heterostructure at a specific portion unlike a film-shaped heterostructure and is not suitable for use due to a problem with reproducibility.

Particularly, when a heterojunction between transition metal chalcogenides is fabricated by chemical vapor deposition, the temperature is increased typically twice. Here, one material is synthesized at a first temperature, and the other material is synthesized at the next temperature, and, thus, the process is complicated. Also, the synthesis is performed at a high temperature (from 600° C. to 900° C.), and, thus, heat generation cost and time loss are high.

Korean Patent No. 10-1523172, which is the background technology of the present disclosure, relates to a method for manufacturing a metal chalcogenide thin film and discloses a method by which an alloy layer of a first metal and a second metal is formed, a second metal chalcogenide thin film is formed by supplying a chalcogen source and the second metal chalcogenide thin film is separated by removing a first metal thin film to transfer the second metal chalcogenide thin film. That is, the above-described patent does not recognize the formation of a heterojunction structure by processing with plasma simply through a one-step process.

Herein, a technique of fabricating a large-area heterojunction between two-dimensional transition metal chalcogenides through a one-step process for penetration of hydrogen sulfide plasma into molybdenum and tungsten film layers by plasma-enhanced chemical vapor deposition is suggested to contribute to the commercialization of two-dimensional materials.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of preparing a heterojunction material, includes forming a first transition metal on a substrate, forming a second transition metal on the first transition metal, and performing a plasma process containing a chalcogen source on the substrate. The first transition metal and the second transition metal are different from each other.

Each of the first transition metal and the second transition metal may be independently converted into a transition metal chalcogenide by the plasma process.

The plasma process may be performed in the presence of an inactive gas selected from the group consisting of argon (Ar), nitrogen ($N_2$), helium (He), neon (Ne), and combinations thereof.

A reactivity of the chalcogen gas may be increased by the inactive gas.

The plasma process may be performed by supplying the chalcogen source and the inactive gas at a flow rate ratio of from 0.5:1 to 1:1.5.

Each of the chalcogen source and the inactive gas may be independently supplied at a flow rate of from 5 sccm to 15 sccm.

The plasma process may be performed at a temperature of from 250° C. to 350° C.

The chalcogen source may include a member selected from the group consisting of $H_2S$, S, Se, Te, $H_2Se$, $H_2Te$, and combinations thereof.

Each of the first transition metal and the second transition metal may be independently a transition metal selected from the group consisting of Mo, W, Cu, Ni, Sc, Ti, V, Cr, Mn, Fe, Co, Zn, Y, Zr, Nb, Tc, Ru, Rh, Pd, Ag, Cd, Hf, Ta, Re, Os, Ir, Pt, Au, Hg, Rf, Db, Sg, Bh, Hs, Mt, Ds, Rg, Cn, and combinations thereof.

Each of the first transition metal and the second transition metal may be independently formed by a method selected from the group consisting of electron-beam evaporation, RF/DC sputtering, ion beam sputtering, ion plating, and combinations thereof.

The substrate may include a material selected from the group consisting of polyimide, polycarbonate, polyethylene naphthalate, polynorbornene, polyacrylate, polyvinyl alcohol, polyethylene terephthalate, polyethersulfone, polystyrene, polypropylene, polyethylene, polyvinyl chloride, polyamide, polymethacrylate, polydimethylsiloxane, polyphenylsulfide, polyether ether ketone, and combinations thereof.

In another general aspect, a heterojunction material, includes a substrate, a first transition metal chalcogenide layer, and a second transition metal chalcogenide layer formed on the first transition metal chalcogenide layer. The first transition metal chalcogenide and the second transition metal chalcogenide form a heterojunction structure.

A band gap of the heterojunction material may be controlled.

Each of the first transition metal and the second transition metal is independently a transition metal selected from the group consisting of Mo, W, Sc, Ti, V, Cr, Mn, Fe, Co, Ni, Cu, Zn, Y, Zr, Nb, Tc, Ru, Rh, Pd, Ag, Cd, In, Sn, Sb, La, Hf, Ta, Re, Os, Ir, Pt, Hg, Tl, Pb, Bi, Po, and combinations thereof.

The chalcogen may include a member selected from the group consisting of S, Se, Te, and combinations thereof.

An electronic device may include the heterojunction material.

In another general aspect, an electronic device includes a heterojunction structure. The heterojunction structure includes a first transition metal chalcogenide layer, and a second transition metal chalcogenide layer formed on the first transition metal chalcogenide layer. The first transition metal and the second transition metal are different from each other.

Each of the first transition metal chalcogenide layer and the second transition metal chalcogenide layer may be independently converted into transition metal chalcogenide layers by a plasma process containing a chalcogen source.

The plasma process may be performed in the presence of an inactive gas selected from the group consisting of argon (Ar), nitrogen ($N_2$), helium (He), neon (Ne), and combinations thereof.

A reactivity of the chalcogen gas may be increased by the inactive gas.

Other features and aspects will be apparent from the following detailed description, the drawings, and the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Figure 4:
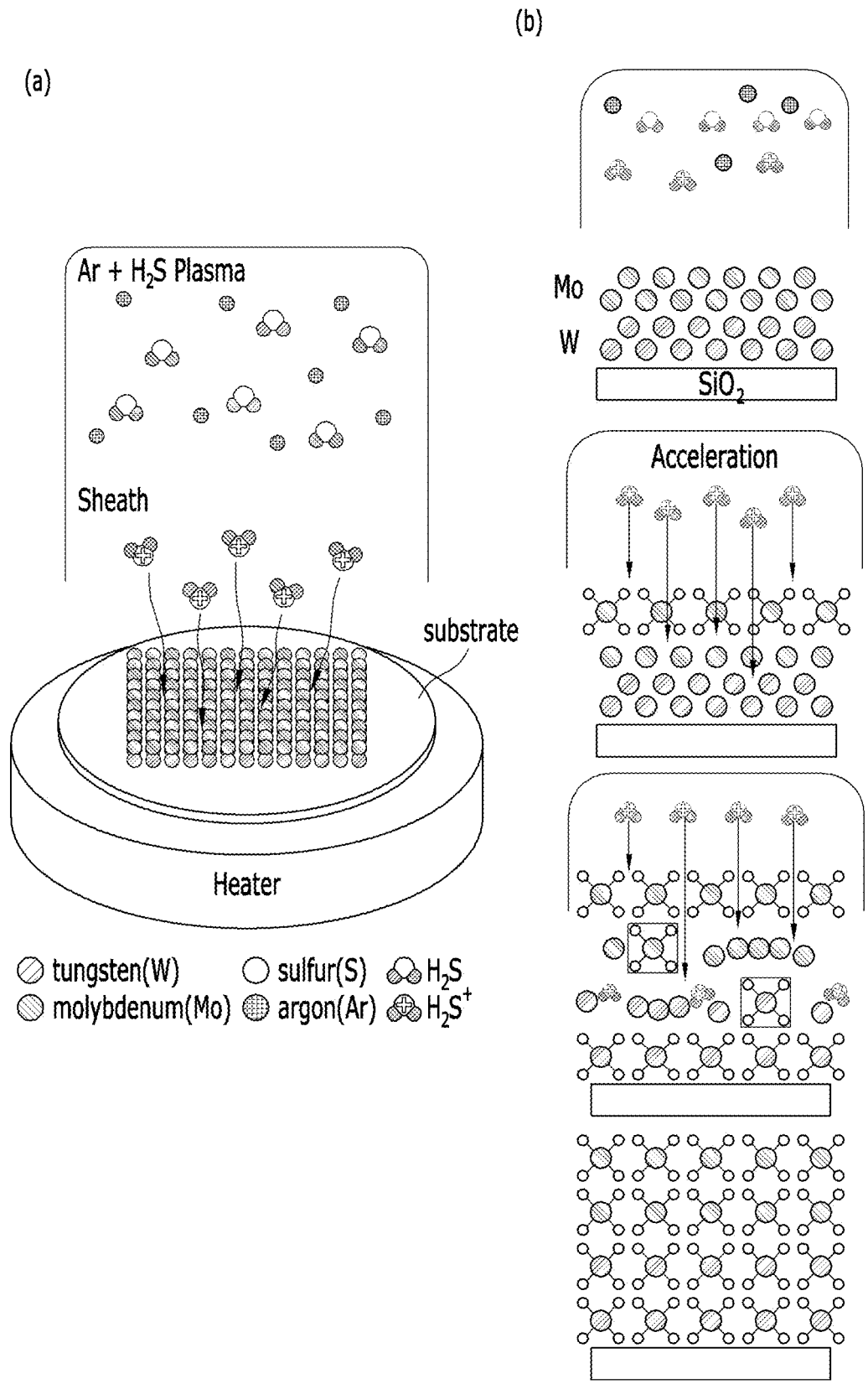

(a) of FIG. 4 is a schematic diagram showing a plasma process in the method of preparing a heterojunction material according to an embodiment of the present disclosure.

(b) of FIG. 4 is a schematic diagram showing a process of synthesizing a heterostructure through a plasma process according to an embodiment of the present disclosure.

Figure 5:
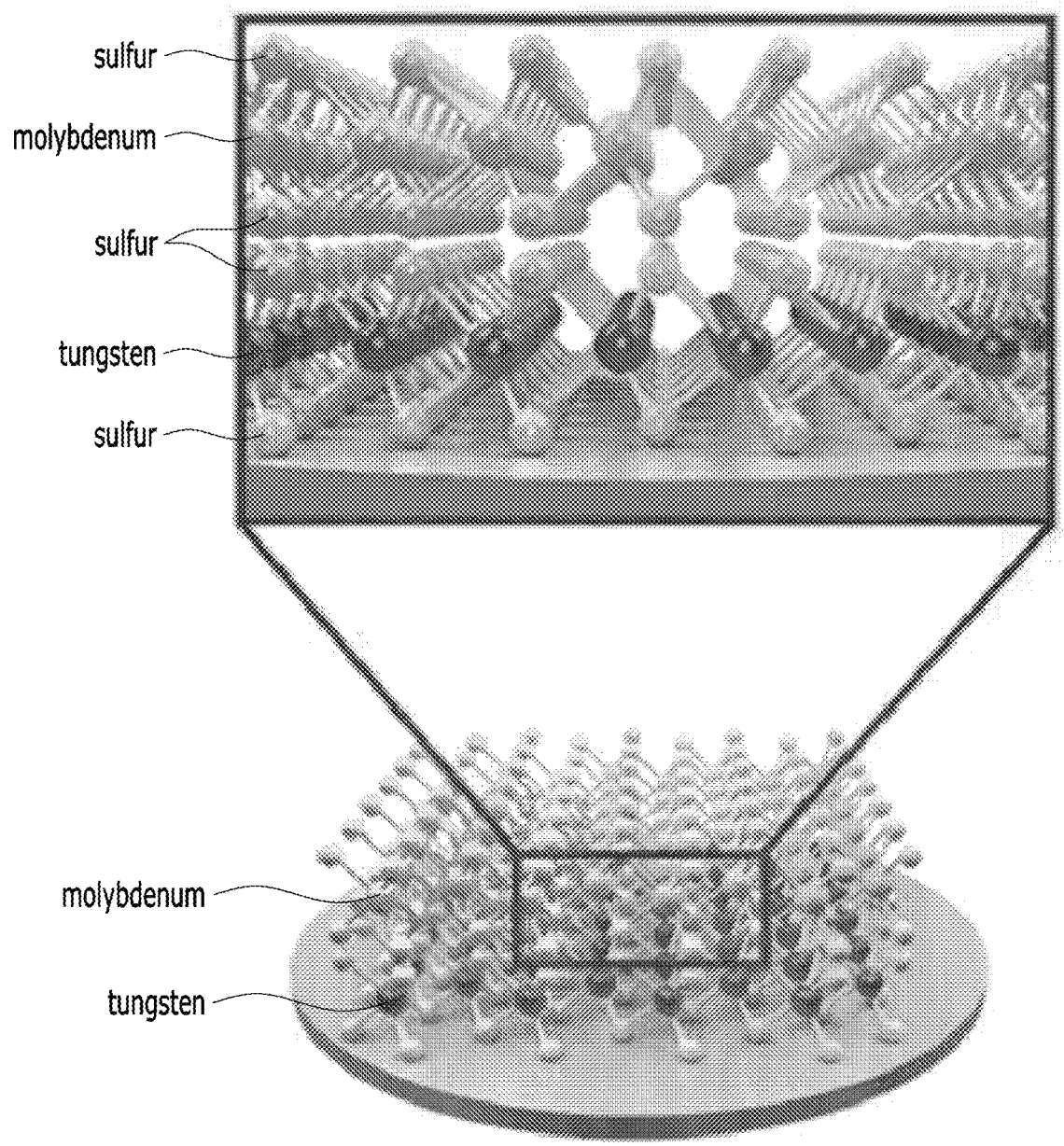

FIG. 5 is a schematic diagram illustrating a heterojunction material according to an embodiment of the present disclosure.

Figure 6:
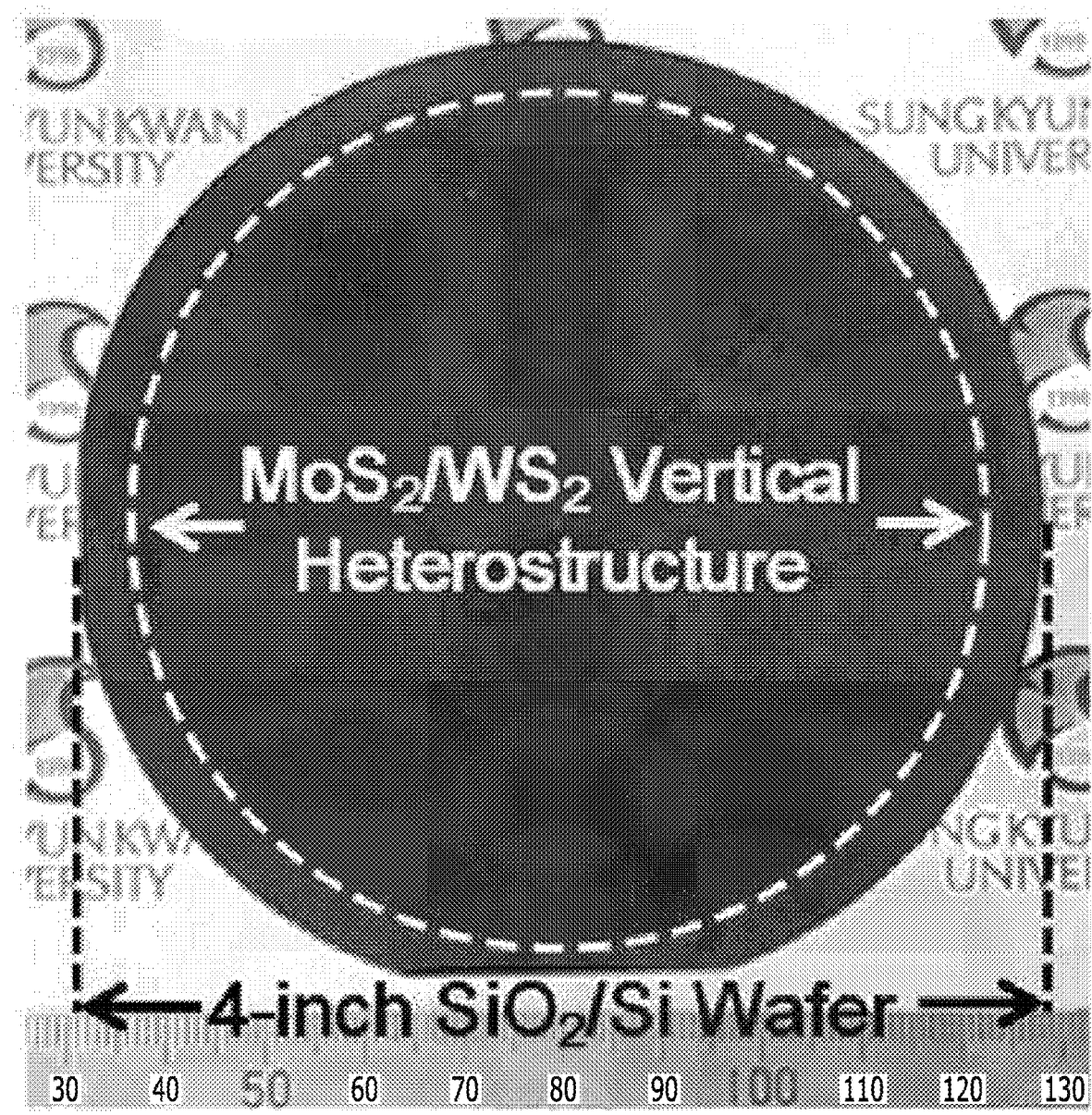

FIG. 6 is a photo of a large-area heterojunction material according to an example of the present disclosure.

Figure 7:
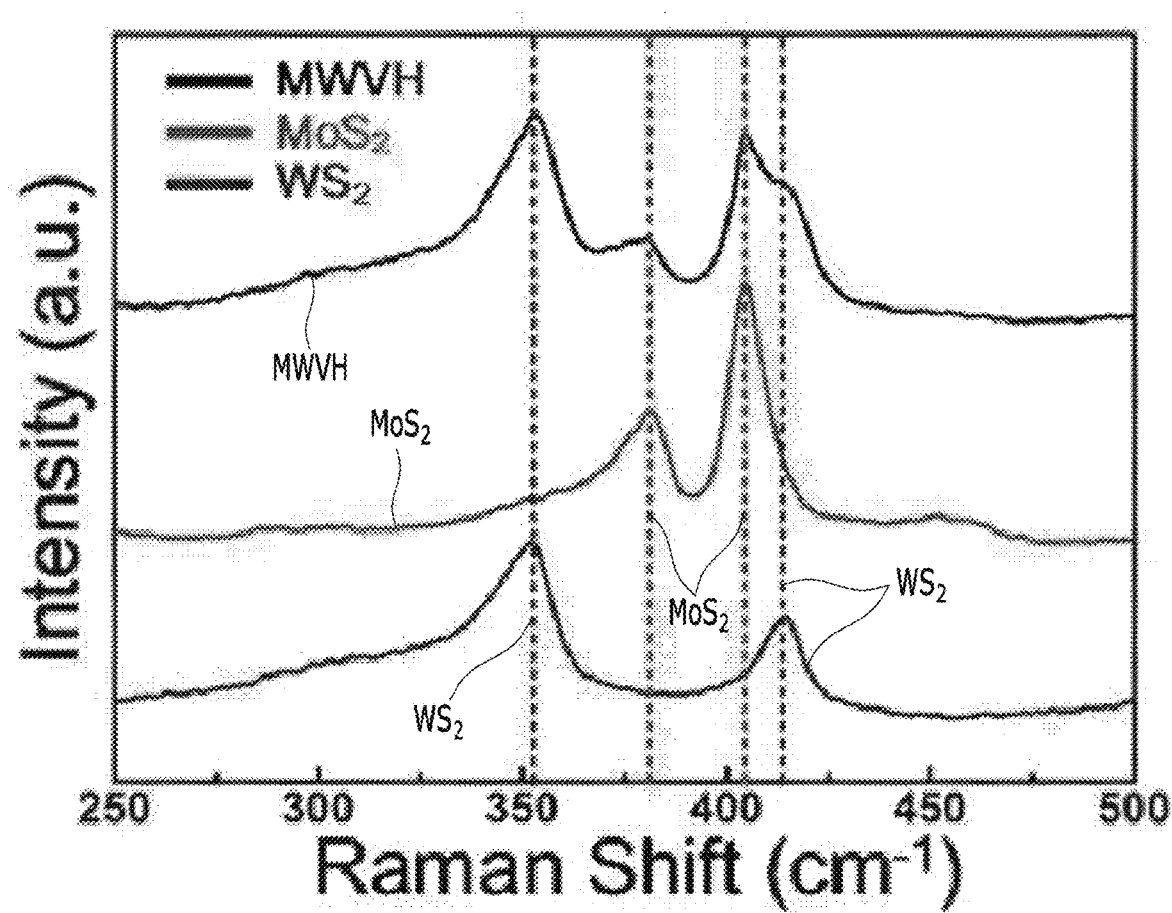

FIG. 7 shows a Raman spectroscopy result of a heterojunction material according to an example of the present disclosure.

Figure 8:
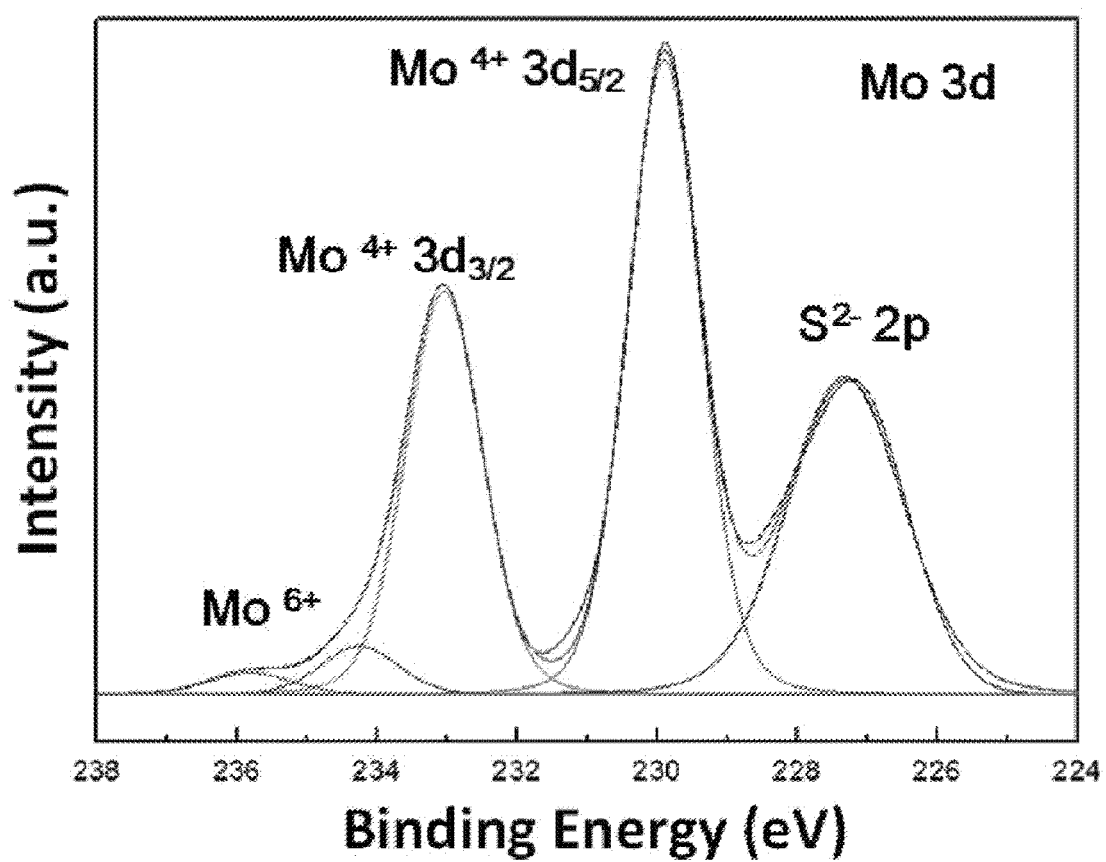

FIG. 8 shows a photoelectron spectroscopy result of a heterojunction material according to an example of the present disclosure.

Figure 9:
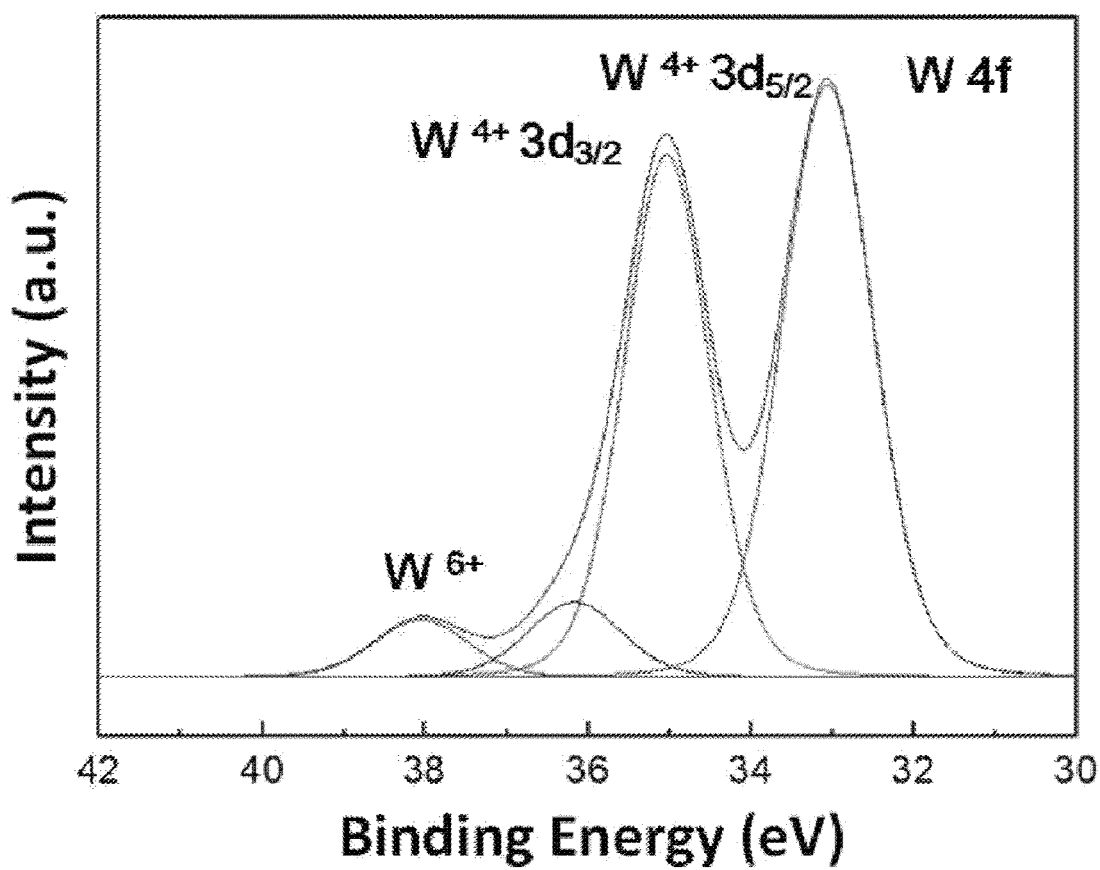

FIG. 9 shows a photoelectron spectroscopy result of a heterojunction material according to an example of the present disclosure.

Figure 10:
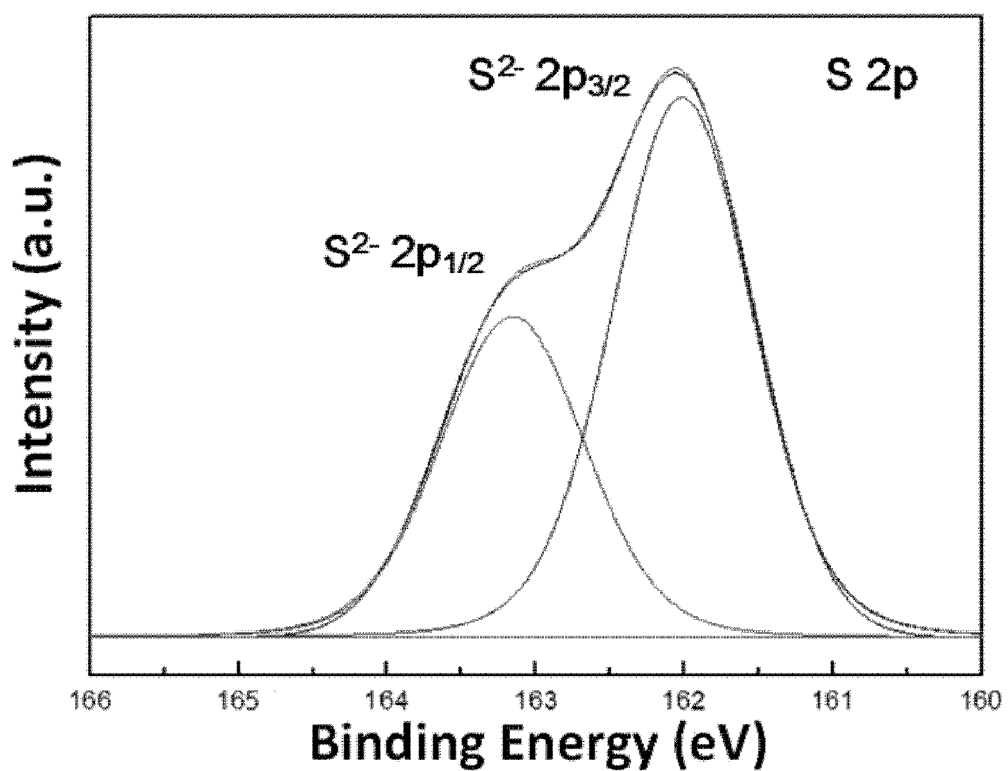

FIG. 10 shows a photoelectron spectroscopy result of a heterojunction material according to an example of the present disclosure.

Figure 11:
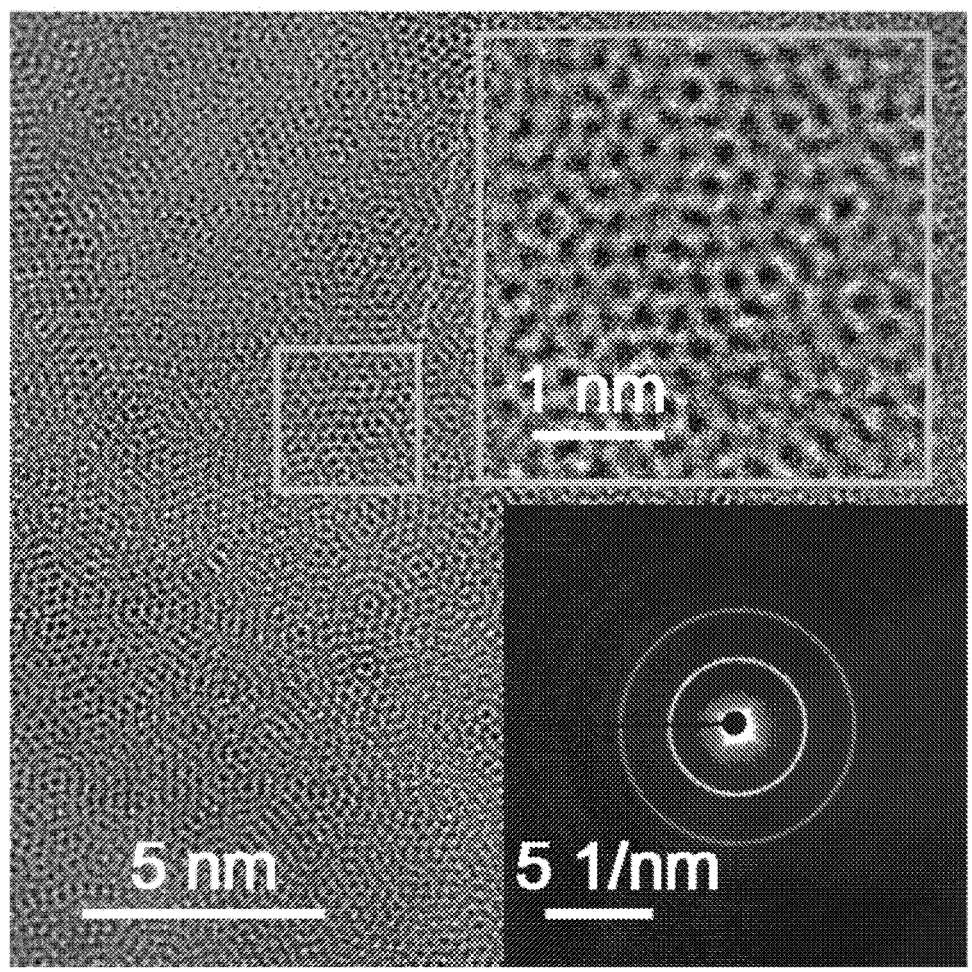

FIG. 11 is an in-plane HR-TEM image of a heterojunction material according to an example of the present disclosure.

Figure 12:
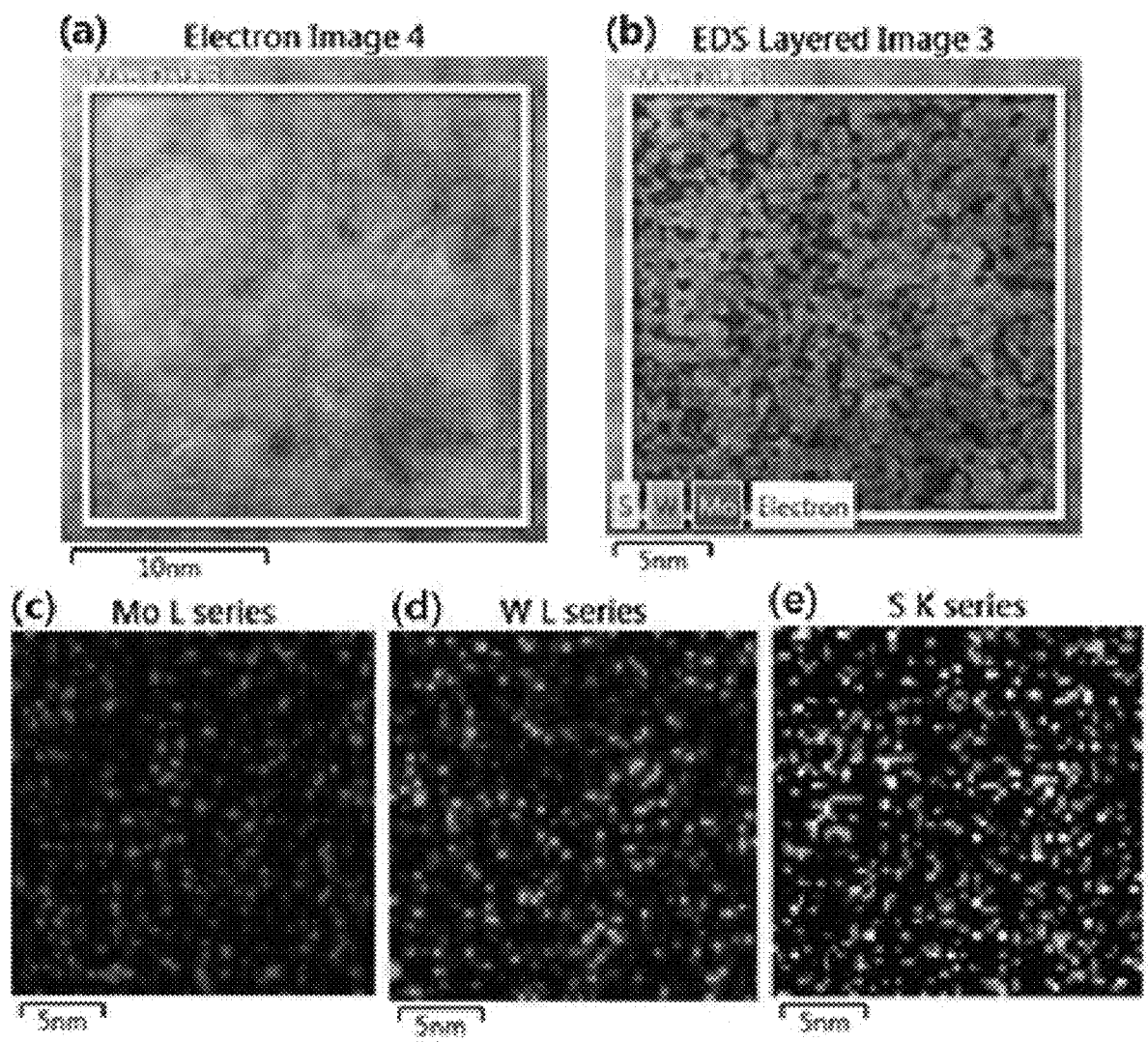

FIG. 12 shows an EDS mapping result of a heterojunction material according to an example of the present disclosure.

Figure 13:
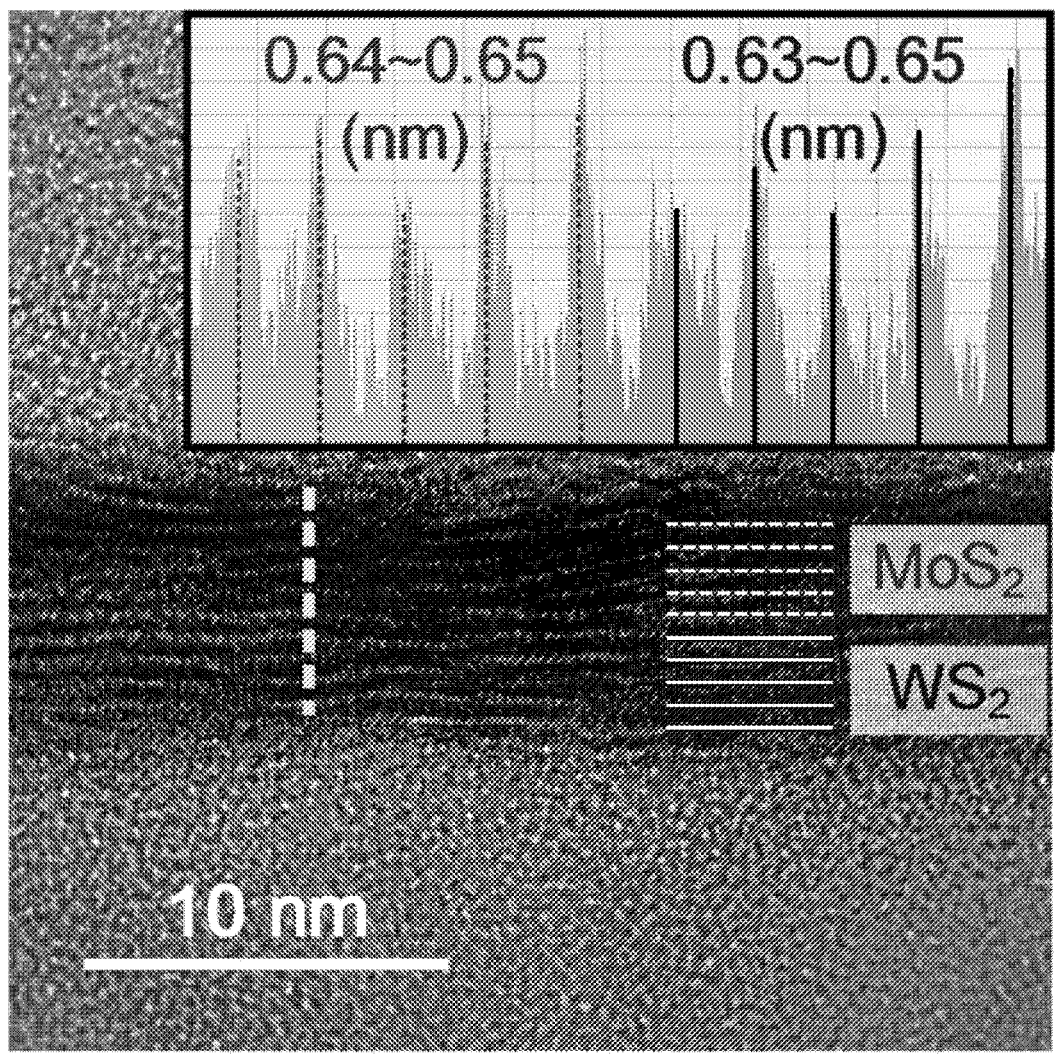

FIG. 13 is a cross-sectional HR-TEM image of a heterojunction material according to an example of the present disclosure.

Figure 14:
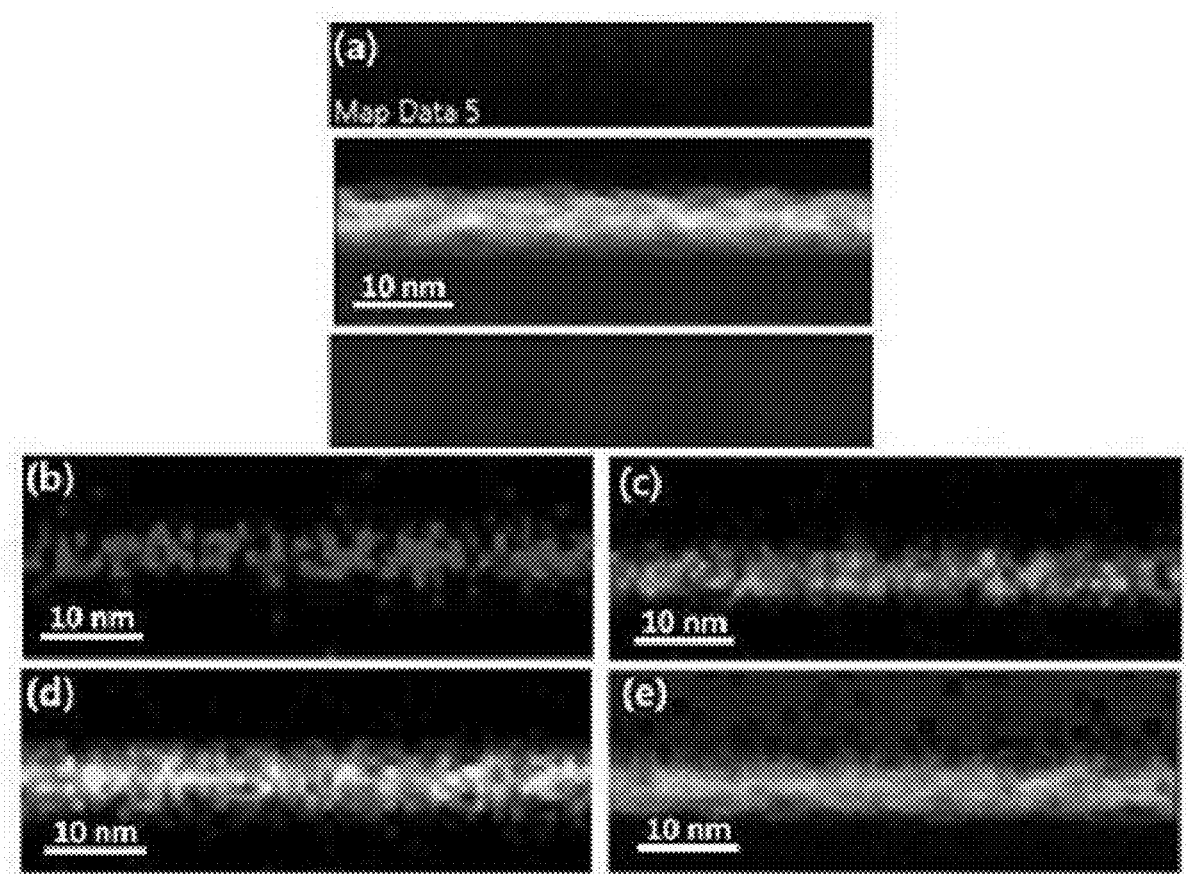

FIG. 14 shows an EDS mapping result of a heterojunction material according to an example of the present disclosure.

Figure 15:
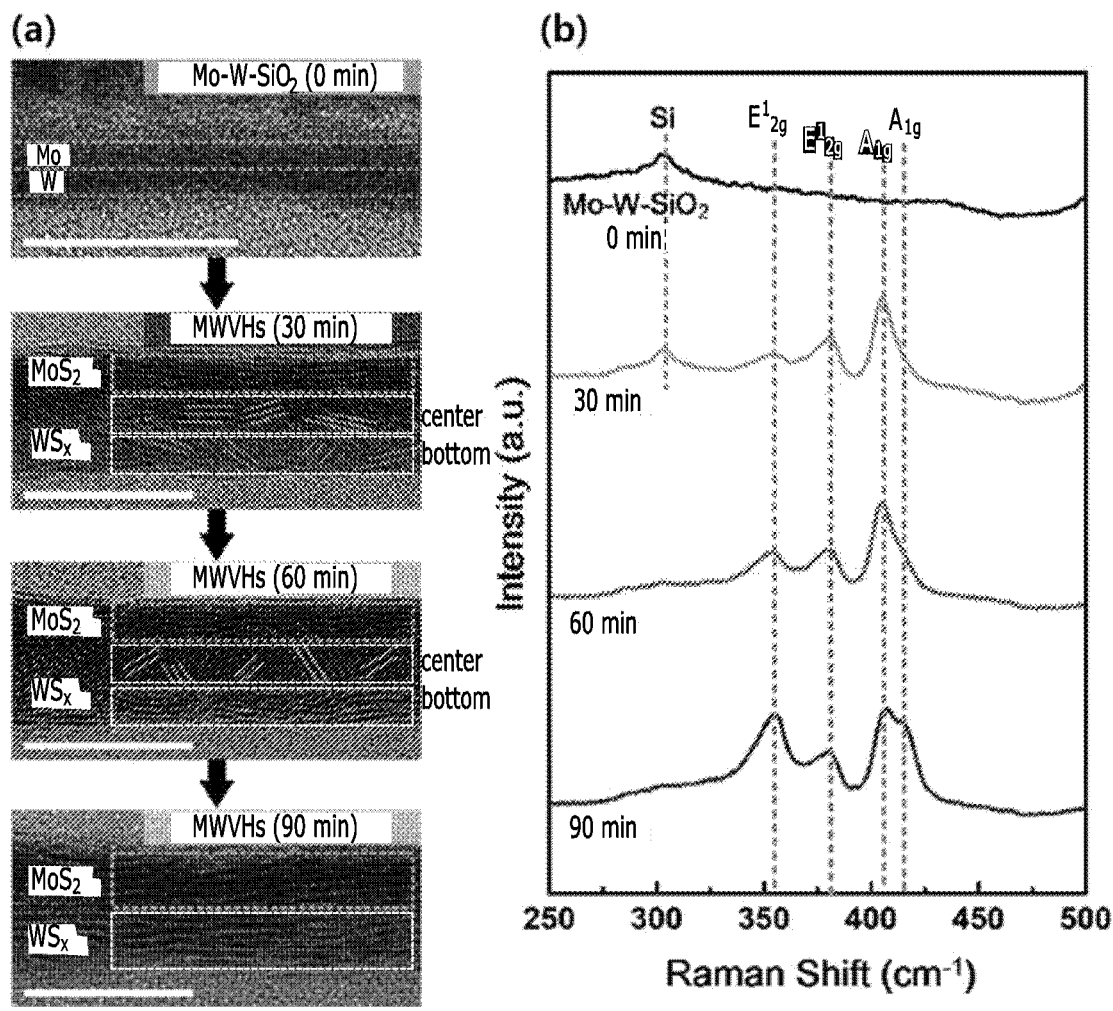

(a) of FIG. 15 shows HR-TEM images of a heterojunction material with synthesis time according to an example of the present disclosure.

(b) of FIG. 15 shows a Raman spectroscopy result of a heterojunction material with synthesis time according to an example of the present disclosure.

(a) of FIG. 16 is an image of a heterostructure diode in which a gold electrode is formed on a heterojunction material of molybdenum disulfide and tungsten disulfide according to a test example of the present disclosure.

(b) of FIG. 16 is a schematic diagram showing a heterostructure diode nanodevice of (a) of FIG. 16.

(c) of FIG. 16 is an image of the heterostructure diode of (a) of FIG. 16 as observed by optical microscopy.

Figure 17:
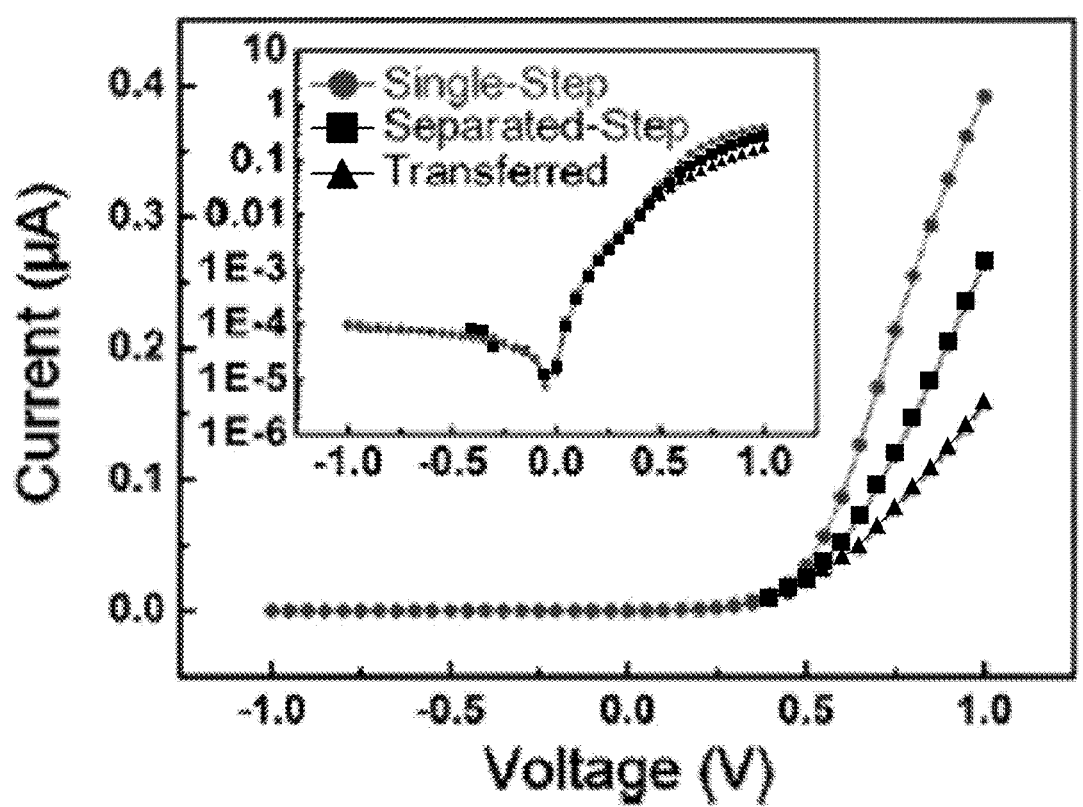

FIG. 17 is a graph comparing the device performance between a diode manufactured by a conventional method and a diode manufactured by a one-step process of the present disclosure according to a test example of the present disclosure.

Figure 18:
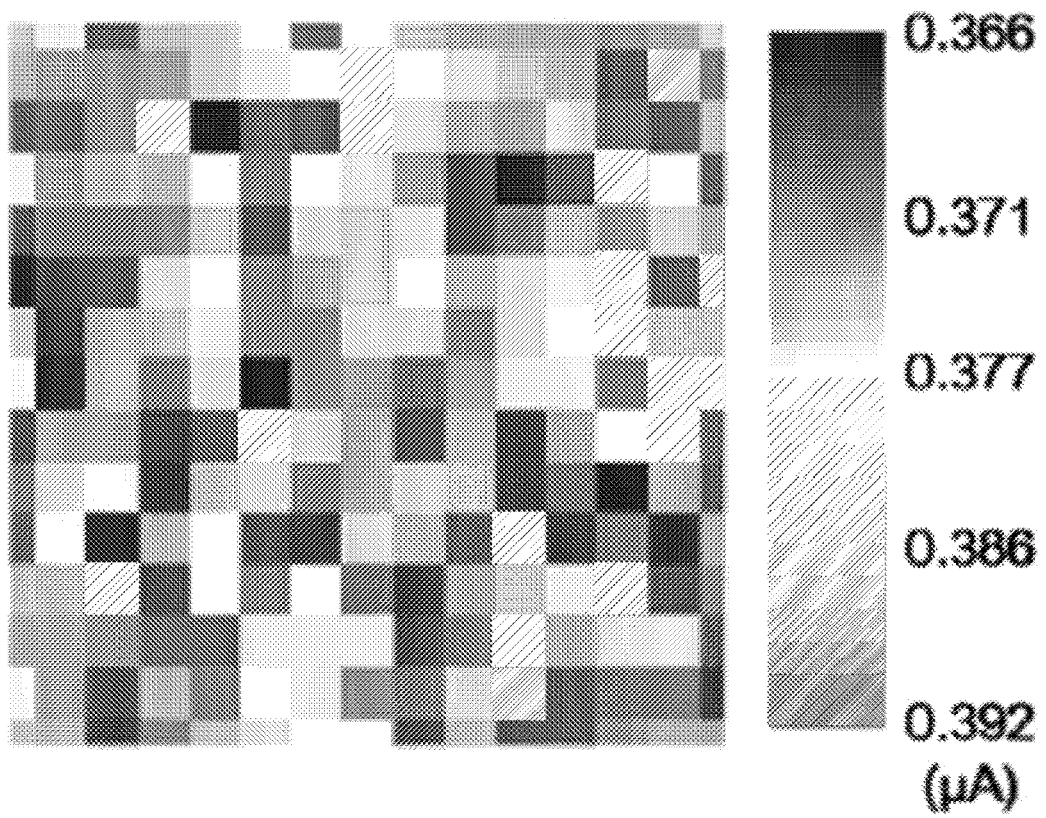

FIG. 18 shows a current mapping result when a voltage of 1.0 V is applied to a heterojunction material according to an example of the present disclosure.

Figure 19:
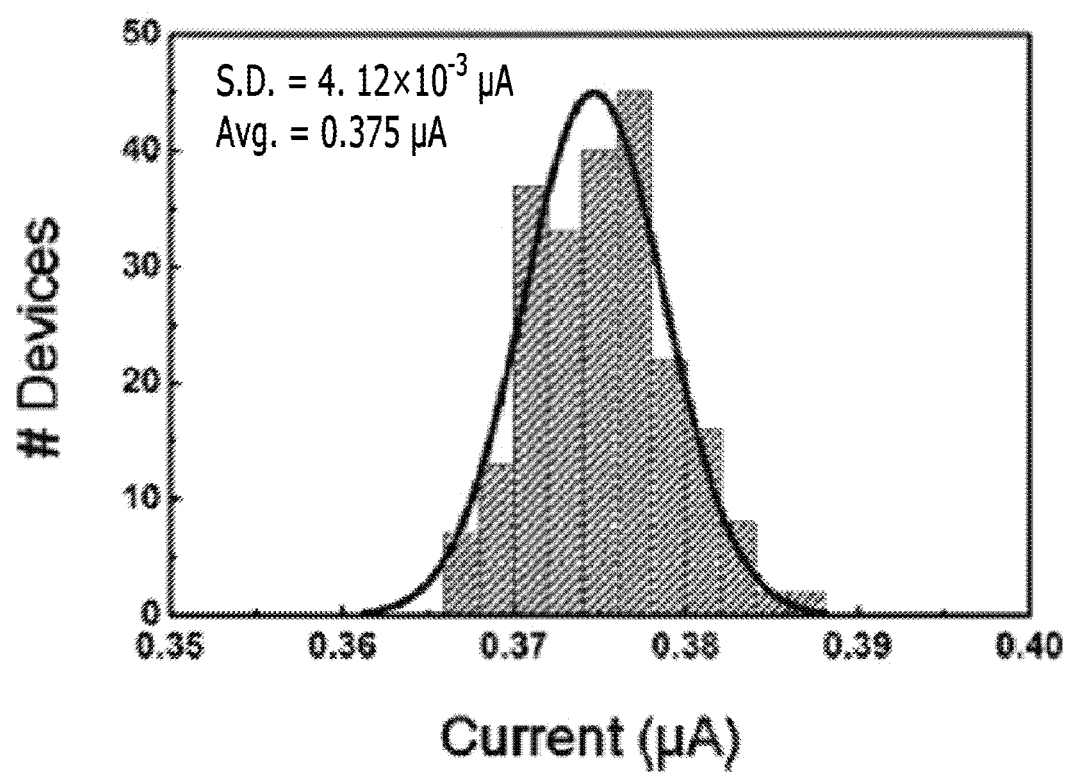

FIG. 19 is a graph showing a current standard deviation and a standard histogram calculated from the current values of FIG. 18.

Figure 20:
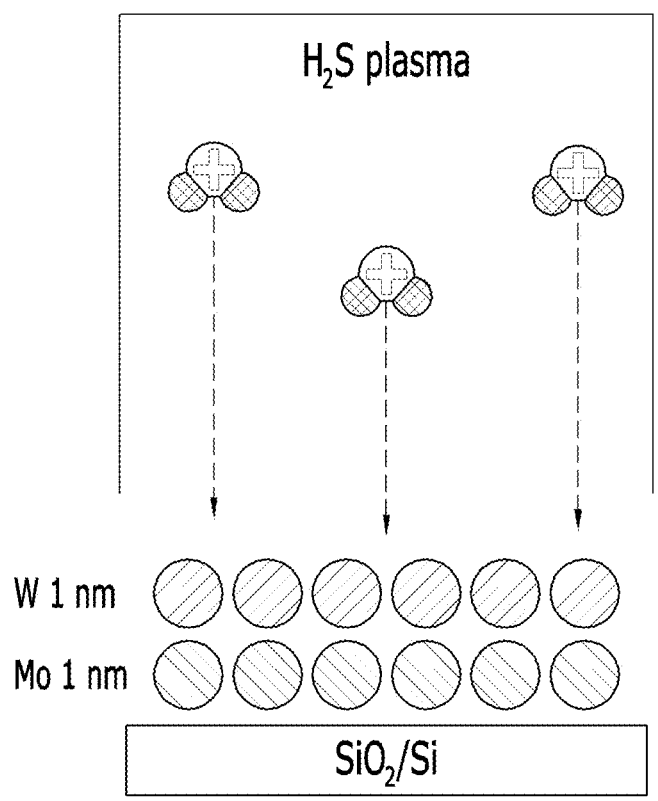

FIG. 20 is a depiction of a plasma process on a heterostructure according to a test example of the present disclosure.

Figure 21:
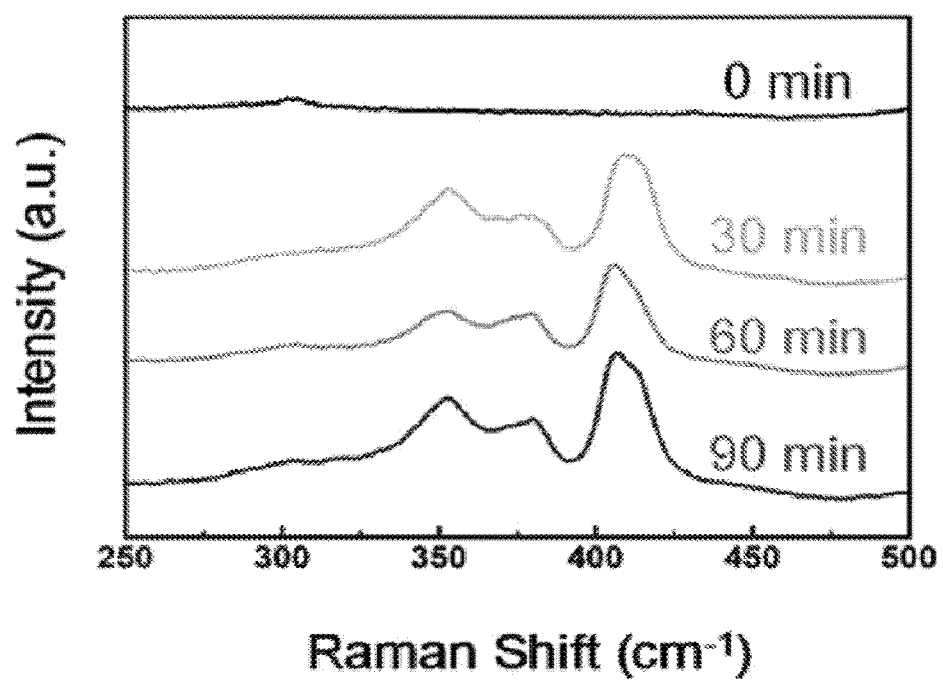

FIG. 21 shows a Raman spectroscopy result of a heterojunction material with plasma process time according to a test example of the present disclosure.

Figure 22:
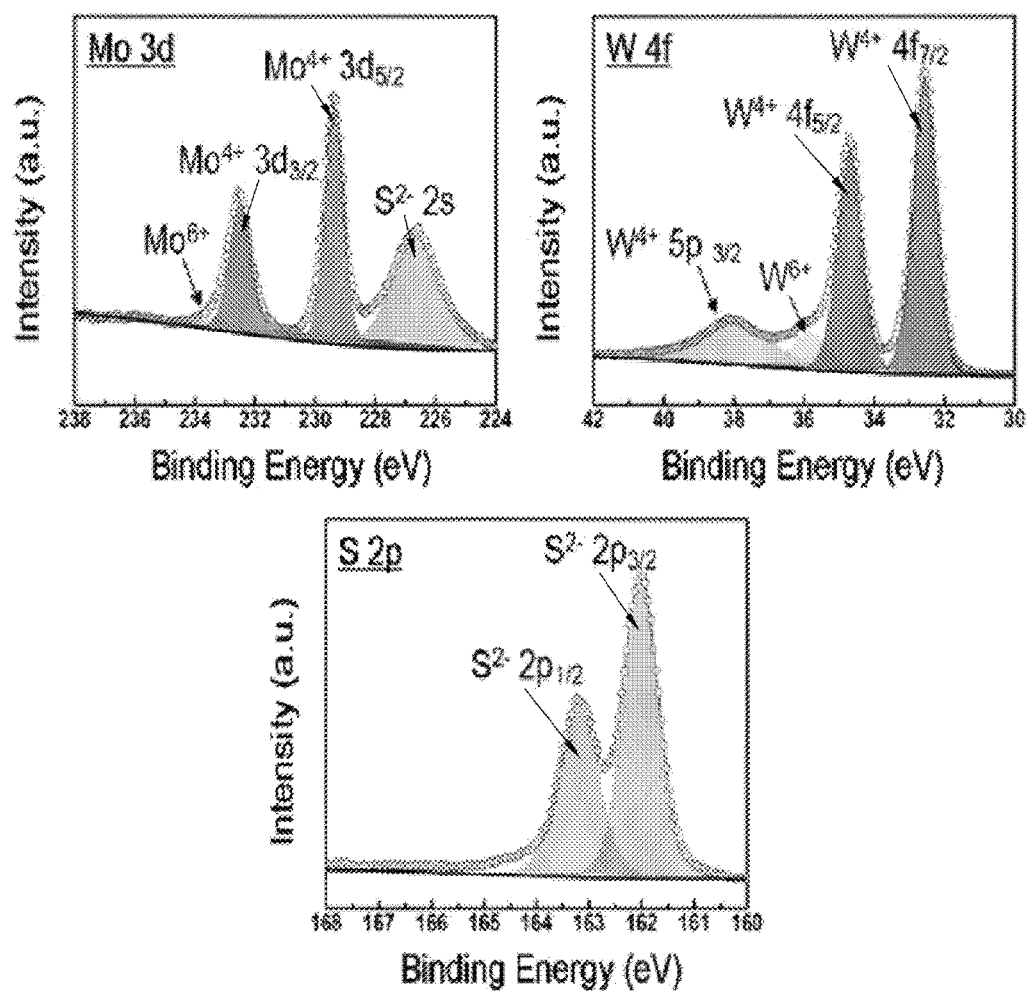

FIG. 22 shows XPS spectrum analysis results of molybdenum (Mo), tungsten (W), and sulfur (S) of a heterojunction material according to a test example of the present disclosure.

(a)-(c) of FIG. 23 are depictions of a plasma process on a heterostructure having molybdenum and tungsten metal layers according to a test example of the present disclosure.

Figure 24:
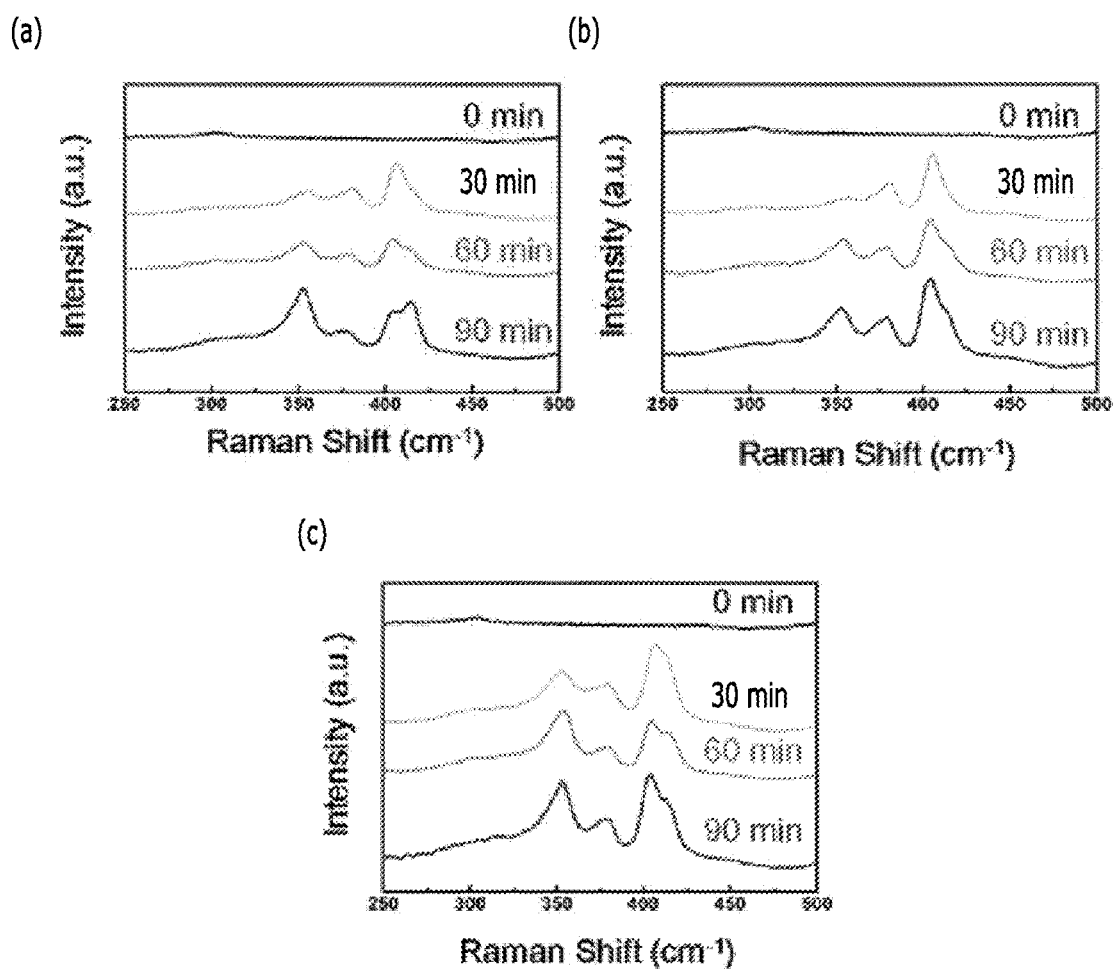

(a)-(c) of FIG. 24 show Raman spectroscopy results of the heterostructures of (a)-(c) of FIG. 23 with synthesis time.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

As a non-exhaustive example only, an electronic device as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device configured to perform wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

According to a first aspect of the present disclosure, there is provided a method of preparing a heterojunction material, including: a process of forming a first transition metal on a substrate; a process of forming a second transition metal on the first transition metal; and a process of performing a plasma process containing a chalcogen source on the substrate on which the first transition metal and the second transition metal have been formed, and the first transition metal and the second transition metal are different from each other.

The term "heterojunction" refers to a junction between layers or regions of dissimilar materials. The heterojunction may refer to, for example, a junction between dissimilar semiconductor materials, a junction between a semiconductor material and a metal, or a junction between a metal, an insulator, and a semiconductor material, but may not be limited thereto.

Hereinafter, the heterojunction in the present disclosure may refer to a junction between dissimilar transition metal chalcogenide layers.

In a heterojunction material according to the present disclosure, a second transition metal is formed on a first transition metal different from the second transition metal and a plasma process containing a chalcogen source is performed thereto, and, thus, both the first transition metal and the second transition metal may be converted into transition metal chalcogenides through a one-step process. Therefore, a transition metal chalcogenide heterojunction structure may be fabricated through a greatly simplified process as compared to when heteromaterials are prepared through respective processes according to the conventional technique.

Further, the heterojunction material according to the present disclosure is prepared by depositing a transition metal on the entire area of a substrate and performing a plasma process thereto without a process using human hands. Also, a high reproducibility may be achieved due to a high uniformity of plasma.

Furthermore, when the heterojunction material according to the present disclosure is prepared, there is no need to perform a transfer process using a polymer unlike a conventional method. Therefore, it is possible to suppress degradation in performance caused by polymer residues and also possible to manufacture a diode with higher performance than a conventional diode. Further, the heterojunction material according to the present disclosure is suitable for mass production.

Moreover, the heterojunction material according to the present disclosure may be prepared through a relatively low-temperature (about 300° C.) process. Therefore, it may be prepared using a flexible substrate that requires a low process temperature. Therefore, the heterojunction material according to the present disclosure may have flexible properties.

Further, in the method of preparing a heterojunction material according to the present disclosure, a heterojunction material may be prepared through a plasma process regardless of a deposition sequence and a deposition thickness of metals.

Figure 1:
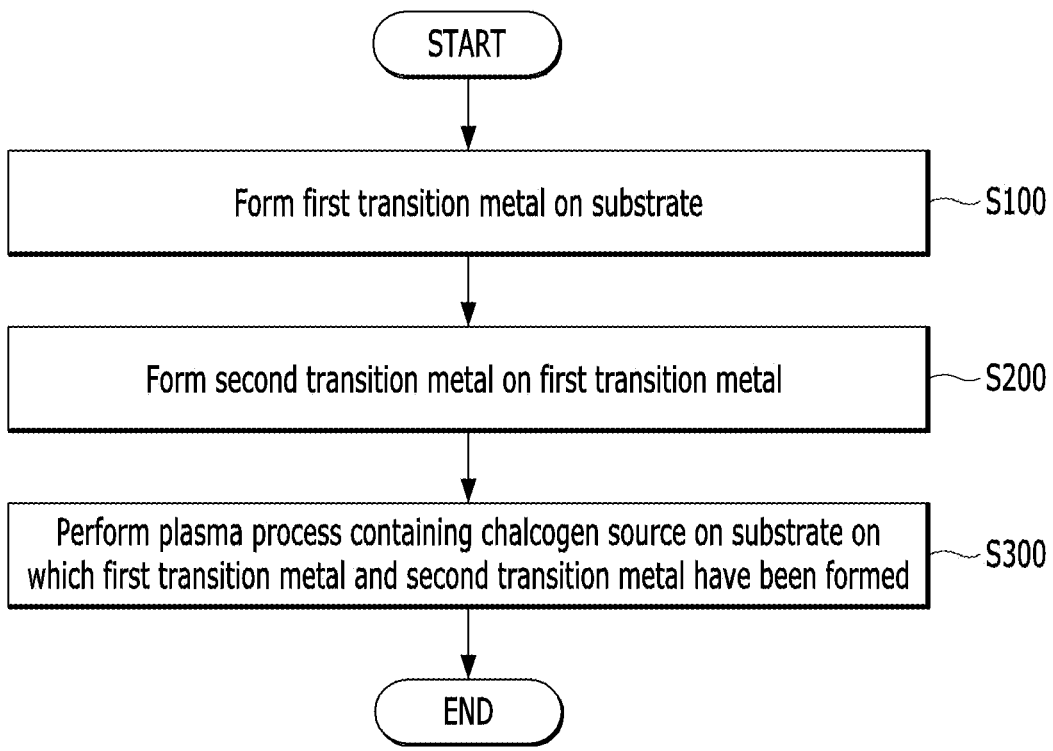
FIG. 1 is a flowchart showing a method of preparing a heterojunction material according to an embodiment of the present disclosure.

FIG. 1 is a flowchart showing a method of preparing a heterojunction material according to an embodiment of the present disclosure.

First, a first transition metal is formed on a substrate (S100).

Figure 2:
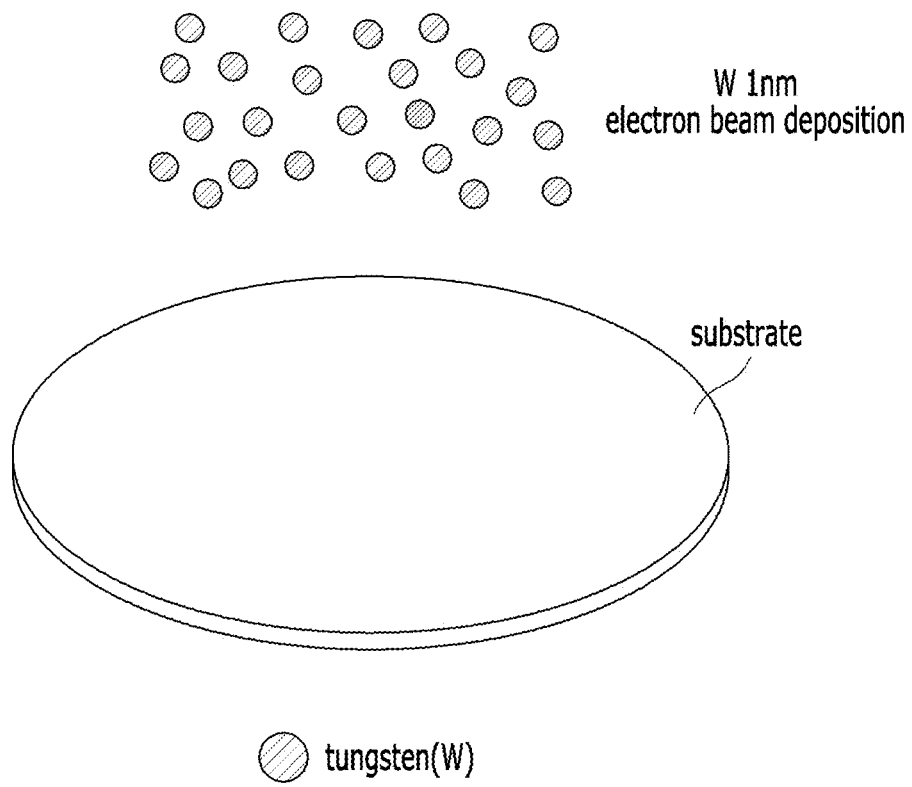
FIG. 2 is a schematic diagram showing a process of forming a first transition metal in preparing a heterojunction material according to an embodiment of the present disclosure.

FIG. 2 illustrates an example where a tungsten (W) thin film is deposited to a thickness of about 1 nm on a substrate through electron-beam evaporation, but the method of preparing a heterojunction material according to the present disclosure is not limited to the example illustrated in FIG. 2. Metal layers may be deposited in different sequences and may be deposited to different thicknesses. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

According to an embodiment of the present disclosure, the first transition metal may be a transition metal selected from the group consisting of W, Mo, Cu, Ni, Sc, Ti, V, Cr, Mn, Fe, Co, Zn, Y, Zr, Nb, Tc, Ru, Rh, Pd, Ag, Cd, Hf, Ta, Re, Os, Ir, Pt, Au, Hg, Rf, Db, Sg, Bh, Hs, Mt, Ds, Rg, Cn, and combinations thereof, but may not be limited thereto.

According to an embodiment of the present disclosure, the first transition metal may be formed by a method selected from the group consisting of electron-beam evaporation, RF/DC sputtering, ion beam sputtering, ion plating, and combinations thereof, but may not be limited thereto. Desirably, the first transition metal may be formed by electron-beam evaporation.

In this regard, if a heterojunction material, for example, a heterostructure of $MoS_2$ and $WS_2$, is prepared by a conventional chemical vapor deposition method, three materials of $MoO_3$, $WO_3$ powder and sulfur powder are evaporated in a furnace by applying high temperature and then reacted on a substrate. Thus, in the above-described conventional preparation method through a chemical vapor deposition method, it is difficult to constantly regulate the flow rate and amount, which necessarily results in a decrease in uniformity and reproducibility. Further, in a conventional process of preparing a heterojunction material through mechanical transfer, mechanical peeling needs to be performed two or more times in a transfer process, which causes an error and necessarily results in a decrease in reproducibility.

However, the heterojunction material, according to the present disclosure, is prepared by depositing a transition metal on the entire area of a substrate and performing a plasma process thereto without a process using human hands. Also, a high reproducibility may be achieved due to a high uniformity of plasma.

Also, as will be described later, the heterojunction material according to the present disclosure may be prepared through a relatively low-temperature (about 300° C.) process. Therefore, it may be prepared using a flexible substrate that requires a low process temperature. Therefore, the heterojunction material, according to the present disclosure, may have flexible properties.

According to an embodiment of the present disclosure, the substrate may include a material selected from the group consisting of polyimide, polycarbonate, polyethylene naphthalate, polynorbornene, polyacrylate, polyvinyl alcohol, polyethylene terephthalate, polyethersulfone, polystyrene, polypropylene, polyethylene, polyvinyl chloride, polyamide, polymethacrylate, polydimethylsiloxane, polyphenylsulfide, polyether ether ketone, and combinations thereof, but may not be limited thereto.

Then, a second transition metal is formed on the first transition metal (S200).

Figure 3:
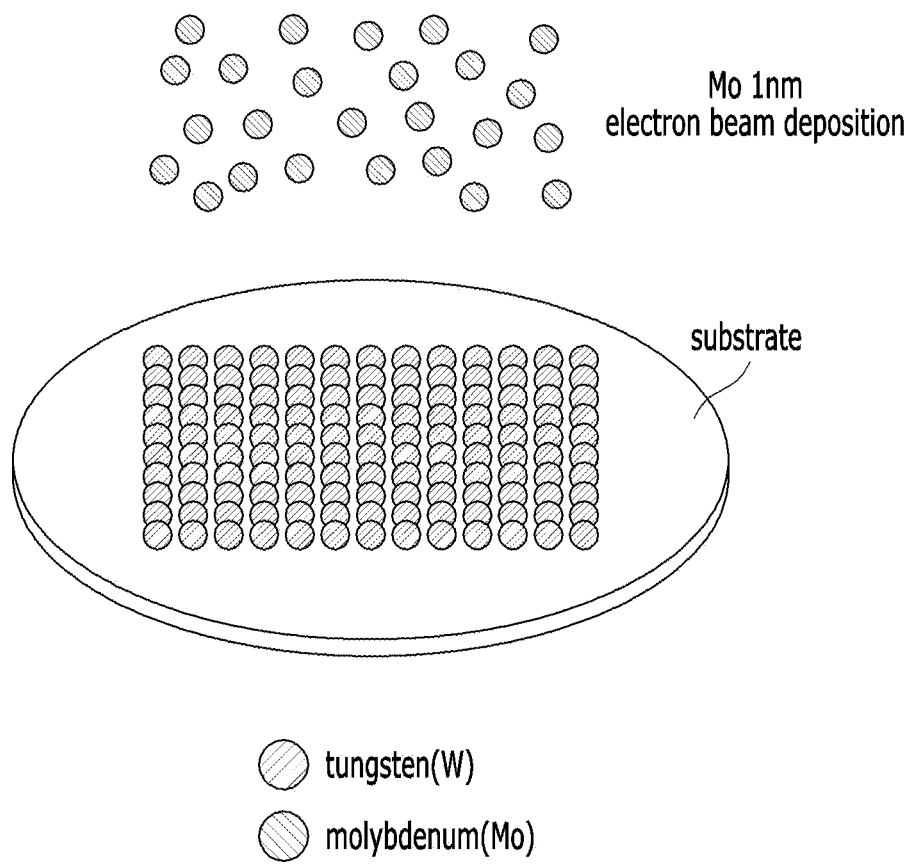
FIG. 3 is a schematic diagram showing a process of forming a second transition metal in preparing a heterojunction material according to an embodiment of the present disclosure.

FIG. 3 illustrates an example where a molybdenum (Mo) thin film is deposited to a thickness of about 1 nm on the tungsten (W) thin film deposited through electron-beam evaporation as shown in FIG. 2, but the method of preparing a heterojunction material according to the present disclosure is not limited to the example illustrated in FIG. 3.

According to an embodiment of the present disclosure, the second transition metal may be a transition metal selected from the group consisting of Mo, W, Cu, Ni, Sc, Ti, V, Cr, Mn, Fe, Co, Zn, Y, Zr, Nb, Tc, Ru, Rh, Pd, Ag, Cd, Hf, Ta, Re, Os, Ir, Pt, Au, Hg, Rf, Db, Sg, Bh, Hs, Mt, Ds, Rg, Cn, and combinations thereof, but may not be limited thereto.

According to an embodiment of the present disclosure, the second transition metal may be formed by a method selected from the group consisting of electron-beam evaporation, RF/DC sputtering, ion beam sputtering, ion plating, and combinations thereof, but may not be limited thereto.

Then, a plasma process containing a chalcogen source is performed on the substrate on which the first transition metal and the second transition metal have been formed (S300).

(a) of FIG. 4 is a schematic diagram showing a plasma process in the method of preparing a heterojunction material according to an embodiment of the present disclosure. (b) of FIG. 4 is a schematic diagram showing a process of synthesizing a heterostructure through a plasma process according to an embodiment of the present disclosure. Hereinafter, the above-described plasma will be described in detail with reference to FIG. 4, but the method of preparing a heterojunction material according to the present disclosure is not limited to the example illustrated in FIG. 4.

As the chalcogen source, a compound containing chalcogen may be used.

According to an embodiment of the present disclosure, the chalcogen source may include a member selected from the group consisting of $H_2S$, S, Se, Te, $H_2Se$, $H_2Te$, and combinations thereof, but may not be limited thereto.

Referring to (a) of FIG. 4, an electron is accelerated by generating an electric field inside a sheath (not shown), and the electron with high energy collides with $H_2S$ so that plasma of $H_2S$ ($H_2S^+$) is generated.

According to an embodiment of the present disclosure, each of the first transition metal and the second transition metal may be independently converted into a transition metal chalcogenide by the plasma process, but may not be limited thereto.

Referring to (a) of FIG. 4, the $H_2S^+$ accelerated toward the substrate may penetrate into the molybdenum thin film and reach the tungsten thin film. Thus, the molybdenum and the tungsten are independently sulfurized and thus may be converted into transition metal chalcogenides of molybdenum disulfide and tungsten disulfide, respectively.

Referring to (b) of FIG. 4, it can be seen that when a metal substrate on which W and Mo are sequentially deposited is processed with Ar+$H_2S$ plasma, ionized $H_2S$ is accelerated toward the substrate by an electric field in a sheath region and penetrates into the Mo—W metal thin film and a heterostructure of molybdenum disulfide and tungsten disulfide is synthesized at an upper part, a lower part and an interface in sequence.

According to an embodiment of the present disclosure, the plasma process may be performed in the presence of an inactive gas selected from the group consisting of argon (Ar), nitrogen ($N_2$), helium (He), neon (Ne), and combinations thereof, but may not be limited thereto.

According to an embodiment of the present disclosure, the reactivity of the chalcogen source may be increased by the inactive gas, but may not be limited thereto.

Referring to (a) of FIG. 4, an argon (Ar) gas is supplied together with the $H_2S^+$ into the sheath so that the argon gas may also be ionized (not shown). The ionized argon gas with high energy may collide with the $H_2S$, which may cause a further increase of the $H_2S^+$. Also, the argon gas enables the $H_2S^+$ to pass through the molybdenum thin film formed as an upper layer and thus easily penetrate deep into two layers of the tungsten thin film and the molybdenum thin film.

In this regard, the Ar is more easily ionized than the $H_2S$ in the plasma sheath, and the ionized Ar+ collides with non-ionized $H_2S$ and exchanges electrons with the non-ionized $H_2S$ while randomly moving so that $H_2S^+$ and Ar are generated. In this way, the Ar may cause a further increase in the number of $H_2S^+$, and, thus, more $H_2S^+$ ions are allowed to penetrate into a metal thin film.

According to an embodiment of the present disclosure, the plasma process may be performed at a temperature of from 250° C. to 350° C., but may not be limited thereto.

Referring to (a) of FIG. 4, a heater is provided under the substrate to supply heat.

The plasma is an ionized gas and has very high reactivity. Accordingly, the heterojunction structure may be fabricated at a relatively low temperature (desirably, about 300° C.) as compared to the conventional technique (for example, when a heterojunction structure is fabricated by chemical vapor deposition, a process temperature of from 600° C. to 900° C. is required).

According to an embodiment of the present disclosure, the plasma process may be performed by supplying the chalcogen source and the inactive gas at a flow rate ratio of from 0.5:1 to 1:1.5, but may not be limited thereto.

According to an embodiment of the present disclosure, each of the chalcogen source and the inactive gas may be independently supplied at a flow rate of from 5 sccm to 15 sccm, but may not be limited thereto.

In the heterojunction material according to the present disclosure, a second transition metal is formed on a first transition metal different from the second transition metal, and a plasma process containing a chalcogen source is performed thereto, and, thus, both the first transition metal and the second transition metal may be converted into transition metal chalcogenides through a one-step process. Therefore, a transition metal chalcogenide heterojunction structure may be fabricated through a greatly simplified process with high reproducibility as compared to when heteromaterials are prepared through respective processes according to the conventional technique.

Conventionally, when a thin film-type heterostructure between transition metal chalcogenides is fabricated, methods employing a mechanical transfer method and a chemical vapor deposition method have been used.

For example, the mechanical transfer method is capable of fabricating only a micro-scale heterostructure and has a very low yield and reproducibility. Also, polymers may be highly contaminated between transfer processes. However, when the heterojunction material according to the present disclosure is prepared, there is no need to perform a transfer process using a polymer. Therefore, it is possible to suppress degradation in performance caused by polymer residues.

Further, for example, when a heterojunction structure is fabricated by conventional chemical vapor deposition, the process is performed at a high temperature (from 600° C. to 900° C.) and thus requires a very high thermal capacity. Therefore, nucleation of a transition metal chalcogenide is performed by stages through two times of annealing. Triangular nucleation of a first transition metal chalcogenide occurs first, and a second transition metal chalcogenide is formed beside or on the triangle. Therefore, it is difficult to control the structure, and the synthesis cannot be performed uniformly on the entire surface of a wafer. However, the heterojunction material according to the present disclosure may be formed into a large-area thin film, and, thus, it is possible to fabricate a uniform heterojunction structure.

According to a second aspect of the present disclosure, there is provided a heterojunction material, including: a substrate; a first transition metal chalcogenide layer; and a second transition metal chalcogenide layer formed on the first transition metal chalcogenide layer, and the first transition metal chalcogenide and the second transition metal chalcogenide form a heterojunction structure.

Detailed descriptions of the heterojunction material according to the second aspect of the present disclosure, which overlap with those of the first aspect of the present disclosure, are omitted hereinafter, but the descriptions of the first aspect of the present disclosure may be identically applied to the second aspect of the present disclosure, even though they are omitted hereinafter.

FIG. 5 illustrates a heterojunction material prepared by performing each process shown in FIG. 2 to FIG. 4, and it can be seen that the heterojunction material has a vertical structure.

Referring to FIG. 5, it can be seen that two kinds of transition metal chalcogenides are bonded to each other by van der Waals force in the structure.

According to an embodiment of the present disclosure, a band gap of the heterojunction material may be controlled, but may not be limited thereto.

In this regard, a transition metal chalcogenide having a unique band gap in the van der Waals vertically layered structure, as shown in FIG. 5, may be applied to a device by controlling a band gap. For example, the band gap may be controlled by regulating the number of layers.

According to an embodiment of the present disclosure, the chalcogen may include a member selected from the group consisting of S, Se, Te, and combinations thereof, but may not be limited thereto.

According to a third aspect of the present disclosure, there is provided an electronic device, including the heterojunction material, according to the second aspect of the present disclosure.

Detailed descriptions of the electronic device according to the third aspect of the present disclosure, which overlap with those of the first aspect and/or the second aspect of the present disclosure, are omitted hereinafter, but the descriptions of the first aspect and/or the second aspect of the present disclosure may be identically applied to the third aspect of the present disclosure, even though they are omitted hereinafter.

Hereinafter, the present disclosure will be described in more detail with reference to examples. The following examples are provided only for explanation, but do not intend to limit the scope of the present disclosure.

EXAMPLE

To fabricate a large-area thin film-type heterojunction of two-dimensional transition metal chalcogenides, tungsten and molybdenum were sequentially deposited to thicknesses of 1 nm and 1 nm, respectively, by an electron-beam evaporator. A substrate on which the two metals were deposited was put into a plasma chemical vapor deposition chamber, and plasma was generated by applying a voltage of 550 W at 300° C. with a flow rate ratio of 40:10 (sccm) for Ar:$H_2S$ to fabricate a thin film-type heterojunction structure of molybdenum disulfide and tungsten disulfide. By performing sulfurization on the entire surface of the 4-inch large substrate with plasma, a uniform thin film-type molybdenum disulfide-tungsten disulfide heterostructure with a high reproducibility was fabricated.

FIG. 6 is a photo of a heterojunction material prepared according to an example, and it can be seen that a molybdenum disulfide-tungsten disulfide vertical heterostructure (blue) is formed on a 4-inch $SiO_2$/Si wafer (violet).

Test Example 1

The structure of an example was analyzed by Raman spectroscopy.

FIG. 7 shows a Raman spectroscopy result of a heterojunction material according to an example of the present disclosure.

Referring to FIG. 7, spectra of molybdenum disulfide-tungsten disulfide (MWVH) were measured using a Raman spectroscope, and it can be seen that a heterostructure of molybdenum disulfide-tungsten disulfide (MWVH), including all four peaks, was formed well as compared to molybdenum disulfide ($MoS_2$) and tungsten disulfide ($WS_2$).

Test Example 2

The structure of an example was analyzed by photoelectron spectroscopy.

FIG. 8 to FIG. 10 show photoelectron spectroscopy results of heterojunction materials according to an example of the present disclosure.

FIG. 8 shows an analysis result of Mo 3d orbital electrons, and $Mo^{6+}$ represents an oxidation peak of molybdenum, $Mo^{4+}$ $3d_{3/2}$ and $Mo^{4+}$ $3d_{5/2}$ represent peaks derived from $MoS_2$, and $S^{2-}$ 2s represents a peak derived from an s orbital of S.

FIG. 9 shows an analysis result of W 4f orbital electrons, and $W^{6+}$ represents an oxidation peak of tungsten, $W^{4+}$ $3d_{3/2}$ and $W^{4+}$ $3d_{5/2}$ represent peaks derived from tungsten disulfide.

FIG. 10 shows an analysis result of S 2p orbital electrons, and both $S^{2-}$ $2p_{1/2}$ and $S^{2-}$ $2p_{3/2}$ represent S 2p peaks included in molybdenum disulfide or tungsten disulfide, and, thus, it can be seen that both molybdenum disulfide and tungsten disulfide have S 2p peaks at the same positions.

Test Example 3

The surface of an example was analyzed using an electron microscope.

FIG. 11 is an in-plane HR-TEM image of a heterojunction material according to an example of the present disclosure.

FIG. 11 is a high-resolution transmission electron microscopy image of a vertical thin film-type structure of molybdenum disulfide and tungsten disulfide from the top-view. A trigonal prismatic structure of the transition metal can be seen.

FIG. 12 shows an EDS mapping result of a heterojunction material according to an example of the present disclosure.

FIG. 12 is the electron dispersive spectroscopy elemental mapping of the image in FIG. 11, and it can be seen that Mo (red), W (green), and S (yellow) are evenly distributed.

Test Example 4

The morphology of each layer of a heterojunction structure, according to an example, was analyzed using an electron microscope.

FIG. 13 is a cross-sectional HR-TEM image of a heterojunction material according to an example of the present disclosure.

FIG. 13 is a cross-sectional high-resolution transmission electron microscopy image of a thin film-type heterostructure of molybdenum disulfide and tungsten disulfide, and a focused ion beam (FIB) was used for processing a sample. Further, it can be seen that a plurality of layers is formed.

FIG. 14 shows an EDS mapping result of a heterojunction material according to an example of the present disclosure.

FIG. 14 is the electron dispersive spectroscopy elemental mapping of the image in FIG. 13, and it can be seen that Mo (red), W (green), and S (yellow) are evenly distributed.

Referring to FIG. 14, Mo is located at an upper part and W is located at a lower part, and S is located entirely, and, thus, it can be seen that a thin film-type heterostructure of molybdenum disulfide (upper part) and tungsten disulfide (lower part) is formed.

Test Example 5

The cross-section of an example changing with synthesis time was analyzed using HR-TEM.

(a) of FIG. 15 shows HR-TEM images of a heterojunction material with synthesis time according to an example of the present disclosure. (b) of FIG. 15 shows a Raman spectroscopy result of a heterojunction material with synthesis time according to an example of the present disclosure.

Referring to (a) of FIG. 15, the analysis result of cross-sectional HR-TEM images of two kinds of transition metals (Mo—W) sequentially deposited by an electron-beam evaporator with $H_2S$+Ar plasma time can be seen.

First, it can be seen from the 30-min image that Mo on the surface was synthesized into $MoS_2$, and W at the center and the bottom was changed to $WS_x$ so as to form a hatched layer.

Then, it can be seen from the 60-min image that $WS_x$ at the bottom gradually formed a film in a lateral form, and a hatched layer was formed in the center part.

Finally, it can be seen that 90 minutes after the start of synthesis, both $MoS_2$ and $WS_2$ were synthesized into complete layers, respectively, and a distinct heterointerface was formed.

Referring to (b) of FIG. 15, an analysis result about the formation of peaks of molybdenum disulfide and tungsten disulfide with synthesis time of a heterojunction material can be seen.

No peak was observed at 0 min, and only the Si substrate peak was observed at about 300 $cm^{-1}$. However, at 30 min, molybdenum disulfide was formed at the upper part. Therefore, the $E^1_{2g}$ peak and the $A_{1g}$ peak (red) were observed at about 380 $cm^{-1}$ and about 405 $cm^{-1}$, respectively. At 60 min, the $E^1_{2g}$ peak and the $A_{1g}$ peak of tungsten disulfide appeared more prominently at about 350 $cm^{-1}$ and about 415 $cm^{-1}$, respectively. In the spectra at 90 min, all the peaks of molybdenum disulfide and tungsten disulfide were observed prominently, which means that a heterostructure of molybdenum disulfide and tungsten disulfide was synthesized well.

Test Example 6

A test for confirming the device performance was conducted using a heterojunction material structure of molybdenum disulfide and tungsten disulfide obtained by plasma synthesis.

(a) of FIG. 16 is an image of a heterostructure diode in which a gold electrode is formed on a heterojunction material of molybdenum disulfide and tungsten disulfide according to a test example of the present disclosure. (b) of FIG. 16 is a schematic diagram showing a heterostructure diode nanodevice of (a) of FIG. 16. (c) of FIG. 16 is an image of the heterostructure diode of (a) of FIG. 16 as observed by optical microscopy.

Specifically, referring to (a) of FIG. 16, an image of a heterostructure diode obtained by forming a heterostructure of molybdenum disulfide and tungsten disulfide in a large area on a 4-inch Si/$SiO_2$ wafer and depositing a gold electrode using a hardmask can be seen.

Referring to (b) of FIG. 16, a schematic diagram of a diode nanodevice using the heterostructure of molybdenum disulfide and tungsten disulfide can be seen.

Referring to (c) of FIG. 16, the heterostructure of molybdenum disulfide and tungsten disulfide was synthesized on a bottom electrode, and then a top electrode was also formed, as observed by optical microscopy.

FIG. 17 is a graph comparing the device performance between a diode manufactured by a conventional method and a diode manufactured by a one-step process of the present disclosure according to a test example of the present disclosure.

Referring to FIG. 17, it can be seen that the device (single-step) synthesized by the method according to the present disclosure showed the highest current value (performance). It can be seen that as for the amount of current in the positive voltage range, the device (single-step) synthesized by the method according to the present disclosure showed the highest value, whereas the device (transferred) synthesized by the method including a transfer process, which is a conventional method for forming a heterostructure, and the device (separated-step) synthesized by separate synthesis had lower performance than the single-step sample.

This may be because the amount of current decreases due to the presence of impurities inside the transferred sample or the separated-step sample and the amount of current decreases due to inappropriate stacking. Therefore, the single-step synthesis method, which is the method of preparing a heterojunction material according to the present disclosure, does not require an intermediate process, such as transfer, and may improve the electrical performance.

FIG. 18 shows a current mapping result when a voltage of 1.0 V is applied to a heterojunction material according to an example of the present disclosure.

Referring to FIG. 18, each pixel represents a current value, and all of 225 diodes show uniform current values on the whole, which means that the heterojunction material was uniformly synthesized with almost equal performance.

FIG. 19 is a graph showing a current standard deviation and a standard histogram calculated from the current values of FIG. 18.

FIG. 19 shows a standard deviation and a standard histogram calculated from the current values of FIG. 18, and it can be seen that the current values did not show a high deviation and are in a predetermined range.

It can be seen from Test Example 6 that the method of preparing a heterojunction material according to the present disclosure may be performed simply through a single-step process and may fabricate a high-performance device in a large area uniformly.

Test Example 7

A material synthesized by depositing metals in a reverse deposition sequence was analyzed.

FIG. 20 is a depiction of a plasma process on a heterostructure according to a test example of the present disclosure.

Referring to FIG. 20, it can be seen that metal molybdenum (Mo) and tungsten (W) were deposited to thicknesses of 1 nm and 1 nm, respectively, on an Si/$SiO_2$ wafer by an E-beam evaporator in the reverse sequence to that in an example of the present disclosure and then processed with $H_2S$+Ar plasma.

FIG. 21 shows a Raman spectroscopy result of a heterojunction material with plasma process time according to a test example of the present disclosure.

Referring to FIG. 21, metal layers were deposited, and the formation of Raman peaks with sulfur plasma process time was analyzed. It can be seen that the peaks of molybdenum disulfide and tungsten disulfide increased in intensity and appeared more prominently with time.

FIG. 22 shows XPS spectrum analysis results of molybdenum (Mo), tungsten (W), and sulfur (S) of a heterojunction material according to a test example of the present disclosure.

Referring to FIG. 22, each graph shows binding energy corresponding to molybdenum disulfide and tungsten disulfide, and it can be seen that molybdenum disulfide and tungsten disulfide may be synthesized through a one-step process with sulfur plasma due to the elements' bonding characteristics.

It was confirmed from Test Example 7 that a heterojunction material could be prepared through a one-step process by the method according to the present disclosure regardless of a deposition sequence of metals.

Test Example 8

A material synthesized by depositing metals to different thicknesses was analyzed.

FIG. 23 is a depiction of a plasma process on a heterostructure having molybdenum and tungsten metal layers according to a test example of the present disclosure.

(a) of FIG. 23 is a depiction of a process in which metal molybdenum (Mo) and tungsten (W) were deposited to thicknesses of 1 nm and 2 nm, respectively, on an Si/SiO$_2$ wafer by an E-beam evaporator and then processed with H$_2$S+Ar plasma.

(b) of FIG. 23 is a depiction of a process in which metal molybdenum (Mo) and tungsten (W) were deposited to thicknesses of 2 nm and 1 nm, respectively, on an Si/SiO$_2$ wafer by an E-beam evaporator and then processed with H$_2$S+Ar plasma.

(c) of FIG. 23 is a depiction of a process in which metal molybdenum (Mo) and tungsten (W) were deposited to thicknesses of 2 nm and 2 nm, respectively, on an Si/SiO$_2$ wafer by an E-beam evaporator and then processed with H$_2$S+Ar plasma.

FIG. 24 shows Raman spectroscopy results of the heterostructures of FIG. 23 with synthesis time.

Referring to (a)-(c) of FIG. 24, metal layers were deposited, and the formation of Raman peaks with H$_2$S+Ar plasma process time was analyzed. It can be seen that the peaks of the metal deposited thick increased in intensity and appeared more prominently with time.

It was confirmed from Test Example 8 that the method according to the present disclosure could be applied to all the metal layers having various thicknesses, and a heterostructure of molybdenum disulfide and tungsten disulfide may be fabricated to various thicknesses.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of preparing a heterojunction material, the method comprising:
   forming a first transition metal on a substrate;
   forming a second transition metal on the first transition metal different from the first transition metal; and
   performing a plasma process comprising:
   providing a chalcogen source to generate an ionized chalcogen source; and
   converting the first transition metal and the second transition metal on the substrate to a first transition metal chalcogenide and a second transition metal chalcogenide, respectively, by the plasma process.

2. The method of preparing a heterojunction material of claim 1,
   wherein the converting of the first and second transition metals to the first and second transition metal chalcogenides, respectively, comprises:
   penetrating the ionized chalcogen source to the first transition metal and the second transition metal to independently form the first transition metal chalcogenide and the second transition metal chalcogenide, respectively, by the plasma process.

3. The method of preparing a heterojunction material of claim 1,
   wherein the plasma process is performed in the presence of an inactive gas selected from the group consisting of argon (Ar), nitrogen (N$_2$), helium (He), neon (Ne), and combinations thereof.

4. The method of preparing a heterojunction material of claim 3,
   wherein a reactivity of the ionized chalcogen source increases by the inactive gas.

5. The method of preparing a heterojunction material of claim 3,
   wherein the plasma process is performed by supplying the chalcogen source and the inactive gas at a flow rate ratio of 0.5:1 to 1:1.5.

6. The method of preparing a heterojunction material of claim 5,
   wherein each of the chalcogen source and the inactive gas is independently supplied at a flow rate of 5 sccm to 15 sccm.

7. The method of preparing a heterojunction material of claim 1,
   wherein the plasma process is performed at a temperature of 250° C. to 350° C.

8. The method of preparing a heterojunction material of claim 1,
   wherein the chalcogen source includes a member selected from the group consisting of H$_2$S, S, Se, Te, H$_2$Se, H$_2$Te, and combinations thereof.

9. The method of preparing a heterojunction material of claim 1,
   wherein each of the first transition metal and the second transition metal is independently a transition metal selected from the group consisting of Mo, W, Cu, Ni, Sc, Ti, V, Cr, Mn, Fe, Co, Zn, Y, Zr, Nb, Tc, Ru, Rh, Pd, Ag, Cd, Hf, Ta, Re, Os, Ir, Pt, Au, Hg, Rf, Db, Sg, Bh, Hs, Mt, Ds, Rg, Cn, and combinations thereof.

10. The method of preparing a heterojunction material of claim 1,
wherein each of the first transition metal and the second transition metal is independently formed by a method selected from the group consisting of electron-beam evaporation, RF/DC sputtering, ion beam sputtering, ion plating, and combinations thereof.

11. The method of preparing a heterojunction material of claim 1,
wherein the substrate includes a material selected from the group consisting of polyimide, polycarbonate, polyethylene naphthalate, polynorbornene, polyacrylate, polyvinyl alcohol, polyethylene terephthalate, polyethersulfone, polystyrene, polypropylene, polyethylene, polyvinyl chloride, polyamide, polymethacrylate, polydimethylsiloxane, polyphenylsulfide, polyether ether ketone, and combinations thereof.

* * * * *